United States Patent
Hoshi et al.

(10) Patent No.: US 6,815,137 B2
(45) Date of Patent: Nov. 9, 2004

(54) PROCESS FOR PRODUCING POLYMER FINE PARTICLES AND LITHOGRAPHIC PRINTING PLATE PRECURSOR USING THE SAME

(75) Inventors: Satoshi Hoshi, Shizuoka (JP); Koichi Kawamura, Shizuoka (JP); Sumiaki Yamasaki, Shizuoka (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 129 days.

(21) Appl. No.: 10/028,356

(22) Filed: Dec. 28, 2001

(65) Prior Publication Data

US 2002/0182529 A1 Dec. 5, 2002

(30) Foreign Application Priority Data

Dec. 28, 2000 (JP) .................................... P.2000-401985
Feb. 7, 2001 (JP) .................................... P.2001-031189

(51) Int. Cl.$^7$ .............................. G03C 1/72; G03F 7/075
(52) U.S. Cl. .................. 430/138; 430/270.1; 430/272.1; 523/333; 523/334
(58) Field of Search .......................... 430/138, 270.1, 430/302, 272.1; 523/333, 334

(56) References Cited

U.S. PATENT DOCUMENTS

| | | | | |
|---|---|---|---|---|
| 3,476,937 A | * | 11/1969 | Vrancken | 250/315.3 |
| 4,221,862 A | | 9/1980 | Naito et al. | |
| 5,417,164 A | * | 5/1995 | Nishida et al. | 101/453 |
| 5,569,573 A | | 10/1996 | Takahashi et al. | |
| 5,968,689 A | | 10/1999 | Torikoshi et al. | |
| 5,981,151 A | * | 11/1999 | Leenders et al. | 430/353 |
| 6,294,595 B1 | * | 9/2001 | Tyagi et al. | 523/333 |
| 6,323,251 B1 | * | 11/2001 | Perez et al. | 521/134 |
| 6,427,595 B1 | * | 8/2002 | Van Damme et al. | 101/457 |

FOREIGN PATENT DOCUMENTS

| | | |
|---|---|---|
| EP | 0 514 145 A1 | 11/1992 |
| EP | 0 832 739 A1 | 4/1998 |
| EP | 0 976 549 | 7/1998 |
| EP | 0 925 916 | 6/1999 |
| EP | 1 038 666 A2 | 9/2000 |
| EP | 1 057 622 A2 | 12/2000 |
| GB | 939244 | 10/1963 |
| JP | 7-1849 | 1/1995 |
| WO | 99/10186 | 3/1999 |

* cited by examiner

Primary Examiner—Barbara Gilliam
(74) Attorney, Agent, or Firm—Burns, Doane, Swecker & Mathis, L.L.P.

(57) ABSTRACT

A process for producing polymer fine particles comprising: dispersing a solution obtained by dissolving a hydrophobic polymer in a solvent immiscible with water in an aqueous phase comprising fine particles of an oxide or hydroxide of at least one element selected from the group consisting of elements belonging to 2 to 15 groups in the periodic table using a surfactant; or dispersing a solution obtained by dissolving a hydrophobic polymer in a solvent immiscible with water in an aqueous phase comprising a water-soluble resin; and then removing the solvent from the oil droplets to form polymer fine particles dispersed in water.

6 Claims, No Drawings

PROCESS FOR PRODUCING POLYMER FINE PARTICLES AND LITHOGRAPHIC PRINTING PLATE PRECURSOR USING THE SAME

FIELD OF THE INVENTION

The present invention relates to a process for producing polymer fine particles suitable for a lithographic printing plate precursor employing an image forming system wherein polymer fine particles dispersed in a hydrophilic matrix are melted to be coalesced by heating, and also relates to a lithographic printing plate precursor comprising polymer fine particles produced by this production process.

BACKGROUND OF THE INVENTION

Regarding a printing plate for a computer-to-plate system which has remarkably advanced recently, various investigations have been achieved. Among these, for the purpose of further rationalizing a process, i.e., saving one layer and solving a problem of a waste water treatment, has been investigated a lithographic printing plate precursor which can be directly loaded to a printing press to effect printing without being subjected to a developing treatment after exposure, and various methods have been proposed.

One of promising methods is a method using a heat-sensitive lithographic printing plate precursor having a hydrophilic layer (image-recording layer) wherein hydrophobic polymer fine particles are dispersed in a matrix such as a crosslinked hydrophilic resin. When heat is applied to the hydrophilic layer, hydrophobic polymer fine particles are melted to be coalesced so that the surface of the hydrophilic layer is converted to a hydrophobic image area. It has been known that the surface constructed by the hydrophobic image area thus obtained and a hydrophilic non-image area of the hydrophilic resin matrix can be used as a lithographic printing plate using dampening water without requiring a treatment such as a liquid development, i.e., completely being subjected to no treatment.

Has been also known a method using a lithographic printing plate precursor comprising an image-recording layer provided on a support having a hydrophilic surface, obtained by dispersing hydrophobic polymer fine particles in a non-crosslinked hydrophilic matrix, wherein an unexposed area is eliminated on a printing press as if the unexposed area has been subjected to a developing treatment by feeding dampening water and an ink to a plate having been exposed with infrared ray with rotating a cylinder of the printing press (on-press developing method). Namely, the method comprises a plate-making system wherein an exposed printing plate precursor is attached to the printing press without applying any treatment, and a treatment is to be completed during an ordinary printing process, further the surface construction of the printing plate comprises a hydrophobic image area formed upon heating and the hydrophilic surface of the support.

Such a lithographic printing plate precursor suitable for quite no treatment or for the on-press development is attached as it is on a printing press placed in a bright room and is used for printing. Thus, the lithographic printing plate precursor is required to have such a property that it does not cause any problem upon being irradiated with room light (bright room handling property). This bright room handling property has been known to be achieved by utilizing a heat-mode recording wherein exposure to a printing plate precursor is effected with infrared ray and an image is formed with heat generated by the absorption of infrared ray.

For example, in JP-A-7-1849 (The term "JP-A" as used herein means an "unexamined published Japanese patent application") JP-A-7-1850, JP-A-10-6468 and JP-A-11-70756, is disclosed a heat-sensitive lithographic printing plate precursor comprising a hydrophilic layer having microcapsules including a lipophilic component encapsulated therein as lipophilic (hydrophobic) fine particles dispersed in a crosslinked hydrophilic binder polymer. It is described therein that after applying heat, printing can be effected without effecting any treatment.

Further, in Japanese patent No. 2938397, JP-A-9-127683 and WO 99-10186, is disclosed a lithographic printing plate precursor comprising a heat-sensitive layer (image-recording layer) wherein fine particles of a thermoplastic hydrophobic polymer are dispersed in a hydrophilic binder polymer, provided on a hydrophilic support. It is further described in these publications that in the lithographic printing plate precursor, after forming an image by subjecting fine particles of a thermoplastic hydriphobic polymer to an infrared ray laser exposure thereby to thermally cause coalescence of the fine particles, the plate is attached to a cylinder of a printing press and development on the printing press can be effected with dampening water and/or an ink.

As a production method of polymer fine particles to be used for the heat-sensitive lithographic printing plate precursor, may be exemplified (1) an emulsified polymerization method, (2) a method comprising dispersing a solution obtained by dissolving a hydrophobic polymer in a solvent immiscible with water in an aqueous hydrophilic polymer solution using a surfactant, and (3) a method comprising dispersing a mechanically pulverized polymer with a surfactant. Among these methods, (2) a method wherein a hydrophobic polymer solution is dispersed with a surfactant has been known as a frequently used convenient method.

A conventional method for dispersing a hydrophobic polymer solution in water using a dispersant comprises an orientation of a hydrophobic moiety of the dispersant to the hydrophobic polymer side and also an orientation of a hydrophilic moiety in an aqueous medium. However, it is impossible that the hydrophobic moieties of the dispersant are all forced to be orientated to the polymer side. The hydrophobic moieties are partially orientated in an aqueous medium. Therefore, it is impossible that the surface of polymer fine particles is made highly hydrophilic. A lithographic printing plate precursor using such polymer fine particles has a problem of deficient hydrophilic property in printing, which is readily stained.

SUMMARY OF THE INVENTION

Accordingly, an object of the present invention is to solve the above problems. Namely, the object of the present invention is to provide a method for producing hydrophobic polymer fine particles having a highly hydrophilic surface.

Another object of the present invention is to provide a lithographic printing plate precursor wherein after exposing the printing plate precursor, it can be attached to the printing press without applying any treatment and can effect printing, and which is improved in staining resistance.

The present inventors have conducted extensive study and research efforts in order to achieve the above-described objects. As the result could be found a process for producing polymer fine particles having a highly hydrophilic surface. Thus, the above-described objects could be achieved.

Namely, it could be found by the present inventors that by the incorporation of an organic silicon group in both a hydrophobic polymer constituting a core part of a polymer fine particle and a hydrophilic resin having dispersibility, a water-soluble resin having a high hydrophilic property is made to effectively function as a dispersant. Thus, it could be found that by utilizing hydrogen bonds derived from silanol groups of both the above-described hydrophobic polymer and the hydrophilic resin, or a firm interaction due to dehydration condensations, a dispersion of polymer fine particles having a highly hydrophilic surface can be stably produced. Thus, the above-described objects could be achieved.

Accordingly, the present invention is as follows:

(1) A process for producing polymer fine particles comprising:

dispersing a solution obtained by dissolving a hydrophobic polymer in a solvent immiscible with water in an aqueous phase comprising fine particles of an oxide or hydroxide of at least one element selected from the group consisting of elements belonging to 2 to 15 groups in the periodic table using a surfactant; or dispersing a solution obtained by dissolving a hydrophobic polymer in a solvent immiscible with water in an aqueous phase comprising a water-soluble resin; and then removing the solvent from the oil droplets to form polymer fine particles dispersed in water.

(2) The process for producing polymer fine particles as described in the above-described item (1), wherein a solution obtained by dissolving a hydrophobic polymer in a solvent immiscible with water is dispersed in the aqueous phase comprising fine particles of an oxide or hydroxide of at least one element selected from the group consisting of elements belonging to 2 to 15 groups in the periodic table using a surfactant, and then the solvent is removed from the oil droplets to form polymer fine particles dispersed in water, and the hydrophobic polymer has the structural unit represented by the following formula (I):

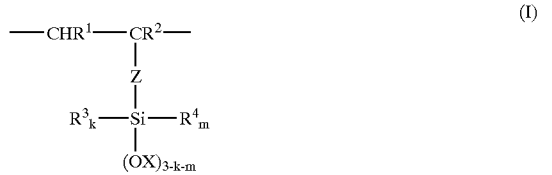

wherein $R^1$, $R^2$ and $R^3$ each represents a hydrogen atom or a hydrocarbon group having 8 or less carbon atoms, $R^4$ represents an alkoxy group or acyloxy group having 1 to 40 carbon atoms, k represents an integer of 0 to 2, m represents an integer of 0 to 3, the sum of k and m is 3 or less, X represents a monovalent metal or a hydrogen atom, Z represents a group selected from the group consisting of the following groups;

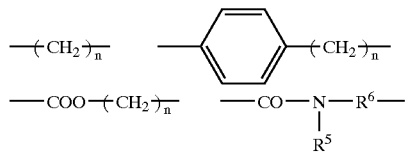

wherein $R^5$ represents a hydrogen atom or a hydrocarbon group having 8 or less carbon atoms, $R^6$ represents an alkylene group having 5 or less carbon atoms or a divalent organic residue formed by linking plural chain carbon atomic groups each other through a carbon atom or a nitrogen atom, n represents an integer of 0 to 4.

(3) The process for producing polymer fine particles as described in the above-described item (2) or item (3), wherein a water-soluble resin is further included in the aqueous phase comprising fine particles of an oxide or hydroxide of at least one element selected from the group consisting of elements belonging to 2 to 15 groups in the periodic table.

(4) The process for producing polymer fine particles as described in the above-described item (3), wherein the water-soluble resin is at least one kind of resin selected from the group consisting of polyvinyl alcohol, polyacrylamide, polyvinyl pyrrolidone, polyacryl acetamide, polyoxazoline, polydimethyl acrylamide, polyethylene glycol, polyacrylic acid, polyvinylmethyl ether and polyethylene imine.

(5) A lithographic printing plate precursor comprising on a support a hydrophilic image-recording layer polymer; containing fine particles obtained by the production method described in anyone of the above-described items (2) to (4), and having a property which can be converted from hydrophilic to hydrophobic by heating.

(6) A process for producing polymer fine particles as described in the above-described item 1, wherein a solution obtained by dissolving a hydrophobic polymer in a solvent immiscible with water is dispersed in an aqueous phase comprising a water-soluble resin, and then the solvent is removed from the oil droplets to form polymer fine particles dispersed in water; and the hydrophobic polymer has the structural unit represented by the following formula (I), and the water-soluble resin has the structural unit represented by the following formula (II) or (III):

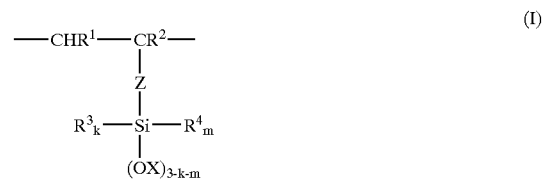

wherein $R^1$, $R^2$ and $R^3$ each represents a hydrogen atom or a hydrocarbon group having 8 or less carbon atoms, $R^4$ represents an alkoxy group or acyloxy group having 1 to 40 carbon atoms, k represents an integer of 0 to 2, m represents an integer of 0 to 3, the sum of k and m is 3 or less, X represents a monovalent metal or a hydrogen atom, Z represents a group selected from the group consisting of the following groups;

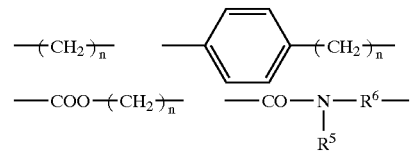

wherein $R^5$ represents a hydrogen atom or a hydrocarbon group having 8 or less carbon atoms, $R^6$ represents an alkylene group having 5 or less carbon atoms or a divalent organic residue formed by linking plural chain atomic groups each other through a carbon atom or a nitrogen atom, n represents an integer of 0 to 4:

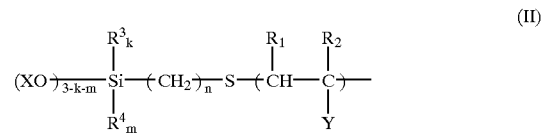

-continued

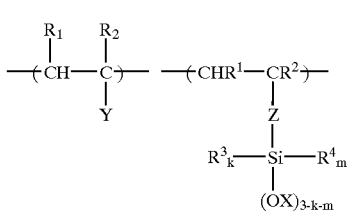

wherein $R^1$ to $R^4$, X, k and m have the same meaning as those in formula (I), Y represents —NHCOCH$_3$, —CONH$_2$, —CON(CH$_3$)$_2$, —COCH$_3$, —OH, —CO$_2$M, —OCH$_3$ or the following group, M represents a hydrogen atom or a metal ion, and n represents an integer of 1 to 8;

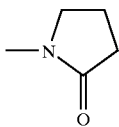

(7) A lithographic printing plate precursor comprising on a support a hydrophilic image-recording layer; containing polymer fine particles produced by the production method described the above-described item (6), and having a property which can be converted from hydrophilic to hydrophobic by heating.

DETAILED DESCRIPTION OF THE INVENTION

The mode for carrying out the invention will be described in detail below.

[Production Method of Polymer Fine Particles]

The hydrophobic polymer to be used in the production method of polymer fine particles of the present invention is a polymer soluble in a solvent immiscible with water. As such a polymer, preferably may be exemplified at least one polymer(s) selected from the group consisting of a thermoplastic polymer, a thermosetting polymer and a polymer having a heat-sensitive functional group.

As a thermoplastic polymer suitable for the present invention, for example, may be exemplified homopolymers, such as ethylene, styrene, vinyl chloride, methyl acrylate, ethyl acrylate, methyl methacrylate, ethyl methacrylate, vinylidene chloride, acrylonitrile and vinyl carbazole; copolymers or the mixtures thereof. In particular, preferably, polystyrene and polymethyl methacrylate may be exemplified.

As a thermosetting polymer suitable for the present invention, for example, may be exemplified a resin having a phenol skeleton, an urea resin (for example, those obtained by converting urea or an urea derivative such as methoxymethylated urea to a resin with an aldehyde such as formaldehyde), a melamine resin (for example, those obtained by converting melamine or a derivative thereof to a resin with an aldehyde such as formaldehyde), an alkyd resin, an unsaturated polyester resin, a polyurethane resin and an epoxy resin.

As a resin having a suitable phenol skeleton, for example, may be exemplified a phenol resin obtained by converting, for example, phenol or cresol to the resin with an aldehyde such as formaldehyde; a hydroxystyrene resin; a methacrylamide or acrylamide resin having a phenol skeleton such as N-(p-hydroxyphenyl)methacrylamide; and a methacrylate or acrylate resin having a phenol skeleton such as N-(p-hydroxyphenyl)methacrylate.

In particular, especially preferred are a resin having a phenol skeleton, a melamine resin, an urea resin and an epoxy resin.

As a heat-reactive functional group of a polymer having the heat-reactive functional group to be used in the present invention, maybe exemplified an ethylenically unsaturated group (for example, acryloyl group, methacryloyl group, vinyl group and allyl group); an isocyanate group effecting an addition reaction or the block product thereof and a functional group having an active hydrogen atom which is to be reacted with the isocyanate group (for example, amino group, hydroxyl group and carboxyl group); an epoxy group also effecting addition reaction, amino group, carboxyl group or hydroxyl group which is to be reacted with the epoxy group; a carboxyl group and a hydroxyl group or an amino group which cause a condensation reaction; an acid anhydride and an amino group or a hydroxyl group which cause a ring-opening addition reaction; and an organic silicon group which thermally renders the vicinity hydrophobic.

Preferable examples of the thermally reactive functional group include an acryloyl group, a methacryloyl group, a vinyl group, an allyl group, an epoxy group, an amino group, a hydroxyl group, a carboxyl group, an isocyanate group, an acid anhydride and a protecting group thereof. The introduction of these functional groups into a polymer can be effected during polymerization or by utilizing a polymer reaction.

Specific examples of the monomer having such a functional group useful in case of introducing during polymerization include allyl methacrylate, allyl acrylate, vinyl methacrylate, vinyl acrylate, glycidyl methacrylate, glycidyl acrylate, 2-isocyanate ethylmethacrylate or the block isocyanate with an alcohol, 2-isocyanate ethylacrylate or the block isocyanate with an alcohol, 2-aminoethyl methacrylate, 2-aminoethyl acrylate, 2-hydroxyethyl methacrylate, 2-hydroxyethyl acrylate, acrylic acid, methacrylic acid, maleic anhydride, bifunctional acrylate and bifunctional methacrylate. However, the monomer is not limited thereto.

As the polymer reaction to be used for introducing a heat-reactive functional group, for example, maybe exemplified a polymer reaction comprising reacting a polymer having a carboxyl group on the side chain thereof with 2-hydroxyethyl methacrylate, 2-aminoethyl methacrylate, glycidyl methacrylate, allylglycidyl ether or 2-isocyanateethyl methacrylate, described in WO-96-34316.

As the especially preferable heat reactive group, an organic silicon group which can be subjected to polycondensation with heat can be exemplified. Among substances comprising an organic silicon group, a resin comprising a structural unit having an organic silicon group represented by the above-described formula (I) as a constituent element is preferable as a hydrophobic polymer noticeably exhibiting the effect of the present invention.

In the combination with a resin forming an image-recording layer, for example, a binder resin of a sol-gel conversion system, the above-described polymer comprising an organic silicon group can directly chemically bond with the binder resin matrix. Therefore, a film having an excellent mechanical strength and abrasion resistance can be formed. In an area which has been irradiated with laser beam to be converted to have hydrophobic property, the above-described polymer comprising an organic silicon group also can form a uniform layer with keeping a chemical bond with a binder resin. Thus, can be formed an image area excellent in abrasion resistance. Accordingly, with a less amount of exposing energy, an image area can be formed, and the image area obtained is excellent in an ink adhesion (i.e., an ink receptivity) and press life.

In these points, the above-described polymer comprising an organic silicon group is especially suitable for the present invention.

The polymer comprising an organic silicon group of the present invention can be obtained by homo-polymerizing an unsaturated double bond-containing monomer which is convertible to the structural unit represented by the above-described formula (I). Alternatively, the polymer can be obtained by a copolymerization of the above-described monomer with a monomer such as styrene, an acryl-based, a vinyl-based or an olefin-based monomer. Further, the polymer comprising an organic silicon group of the present invention comprises, in addition to those wherein the structural units comprising organic silicone groups are randomly introduced in the polymer molecules, those wherein the structural units comprising organic silicone groups are introduced into the molecular ends of the polymer.

Specific examples of the unsaturated double bond-containing monomer convertible to the above-described structural unit comprising an organic silicone group represented by the general formula (I) include styrylethyl trimethoxysilane, 4-trimethoxysilylstyrene, 3-(N-strylmethyl-2-aminoethylamino)propyltrimethoxysilane, vinyltrimethoxysilane, vinyltris-(β-methoxyethoxy)silane, allyltrimethoxysilane, vinyltriacetoxysilane, allyltriacetoxysilane, vinylmethyldimethoxysilane, vinyldimethylmethoxysilane, vinylmethyldiethoxysilane, vinyldimethylethoxysilane, vinylmethyldiacetoxysilane, vinyldimethylacetoxysilane, vinylisobutyldimethoxysilane, vinyltriisopropoxysilane, vinyltributoxysilane, vinyltrihexyloxysilane, vinylmethoxydihexyloxsilane. vinyldimethoxyoctyloxysilane, vinylmethoxydioctyloxysilane, vinyltrioctyloxysilane, vinylmethoxydilauryloxysilane, vinyldimethoxylauryloxysilane, vinylmethoxydioleyloxysilane, vinyldimethoxyoleyloxysilane, 3-(meth)acryloyloxypropyltrimethoxysilane, 3-(meth)acryloyloxypropyltrimethoxysilane, 3-(meth)acrylamide-propyltrimethoxysilane, 3-(meth)acrylamide-propyltrimethoxysilane, 3-(meth)acrylamide-propyltri(β-methoxyethoxy)silane, 2-(meth)acrylamide-2-methylpropyltrimethoxysilane, 2-(meth)acrylamide-2-methylethyltrimethoxysilane, N-(2-(meth)acrylamide-ethyl)-aminopropyltrimethoxysilane, 3-(meth)acrylamide-propyltriacetoxysilane, 2-(meth)acrylamide-ethyltrimethoxysilane, 1-(meth)acrylamide-methyltrimethoxysilane, 3-(meth)acrylamide-propylmethyldimethoxysilane, 3-(meth)acrylamide-propylmethyldimethoxysilane, 3-(N-methyl-(meth)acrylamide)-propyltrimethoxysilane, 3-((meth)acrylamide-methoxy)-3-hydroxypropyltrimethoxysilane, 3-((meth)acrylamide-methoxy)-propyltrimethoxysilane, dimethyl-2-(meth)acrylamide-propyl-3-(trimethoxysily)-propylammonium chloride, and dimethyl-2-(meth)acrylamide-2-methylpropyl-3-(trimethoxy-sily)-propylammonium chloride.

As a copolymerizing component monomer which constitutes an organic silicon group-containing polymer, together with the above-described unsaturated double bond-containing monomer convertible to the structural unit comprising an organic silicone group represented by the formula (I), maybe exemplified monomers shown in (A) to (K) below.

(A) Acrylic acid esters: Examples of this monomer group include (substituted) acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 2-hydroxyethyl acrylate, 4-hydroxybutyl acrylate, glycidyl acrylate, N-dimethylaminoethyl acrylate, and o-, m- and p-hydroxyphenyl acrylate.

(B) Methacrylic acid esters: Examples of this monomer group include (substituted) methacrylic acid esters such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 2-hydroxyethyl methacrylate, 4-hydroxybutyl methacrylate, glycidyl methacrylate, N-dimethylaminoethyl methacrylate, and o-, m- and p-hydroxyphenyl methacrylate.

(C) Acrylamides and methacrylamides: Examples of this monomer group include acrylamides and methacrylamides such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, N-ethyl-N-phenylmethacrylamide, N-(4-hydroxyphenyl)acrylamide, and N-(4-hydroxyphenyl) methacrylamide.

(D) Vinyl ethers: Examples of this monomer group include ethyl vinylether, 2-chloroethyl vinylether, hydroxyethyl vinylether, propyl vinylether, butyl vinylether, octyl vinylether and phenyl vinylether.

(E) Vinyl esters: Examples of this monomer group include vinyl acetate, vinyl chloroacetate, vinyl butyrate and vinyl benzoate.

(F) Styrenes: Examples of this monomer group include styrene, methyl styrene, chloromethyl styrene, and o-, m-, and p-hydroxystyrene.

(G) Vinyl ketones: Examples of this monomer group include methylvinyl ketone, ethylvinyl ketone, propylvinyl ketone and phenylvinyl ketone.

(H) Olefins: Examples of this monomer group include ethylene, propylene, isobutylene, butadiene and isoprene.

(I) N-containing monomers. Examples of this monomer group include N-vinylpyrrolidone, N-vinylcarbazol, 4-vinylpyridine, acrylonitrile and methacrylonitrile.

(J) Unsaturated sulfonamides: Examples of this monomer group include unsaturated sulfonamides, e.g., acrylamides such as N-(o-aminosulfonylphenly)acrylamide, N-(m-aminosulfonylphenyl)acrylamide, N-(p-aminosulfonylphenly)acrylamide, N-[1-(3-aminosulfonyl)naphthyl]acrylamide, and N-(2-aminosulfonylethyl)acrylamide; methacrylamides such as N-(o-aminosulfonylphenly)methacrylamide, N-(m-aminosulfonylphenyl)methacrylamide, N-(p-aminosulfonylphenyl)methacrylamide, N-[1-(3-aminosulfonyl)naphtyl]methacrylamide, and N-(2-aminosulfonylethyl)methacrylamide, acrylic acid esters such as o-aminosulfonylpheflyl acrylate, m-aminosulfonylphenlyl acrylate, p-aminosulfonylphenyl acrylate, and 1-(3-aminosulfonylnaphthyl)acrylate o-aminosulfonylphenyl methacrylate, m-aminosulfonylphenyl methacrylate, p-aminosulfonylphenyl methacrylate, and 1-(3-aminosulfonylnaphthyl)methacrylate.

(K) Unsaturated acid anhydrides: Examples of this monomer group include itaconic anhydride, maleic anhydride, 2,3-dimethyl maleic anhydride, and 2-chloromaleic anhydride.

Organic polymer compounds obtained from these monomers preferably have a weight-average molecular weight of 500 to 500,000 and a number-average molecular weight of 200 to 60,000.

Specific examples of organic silicon group-containing polymers are shown below. However, the present invention is not limited thereto.

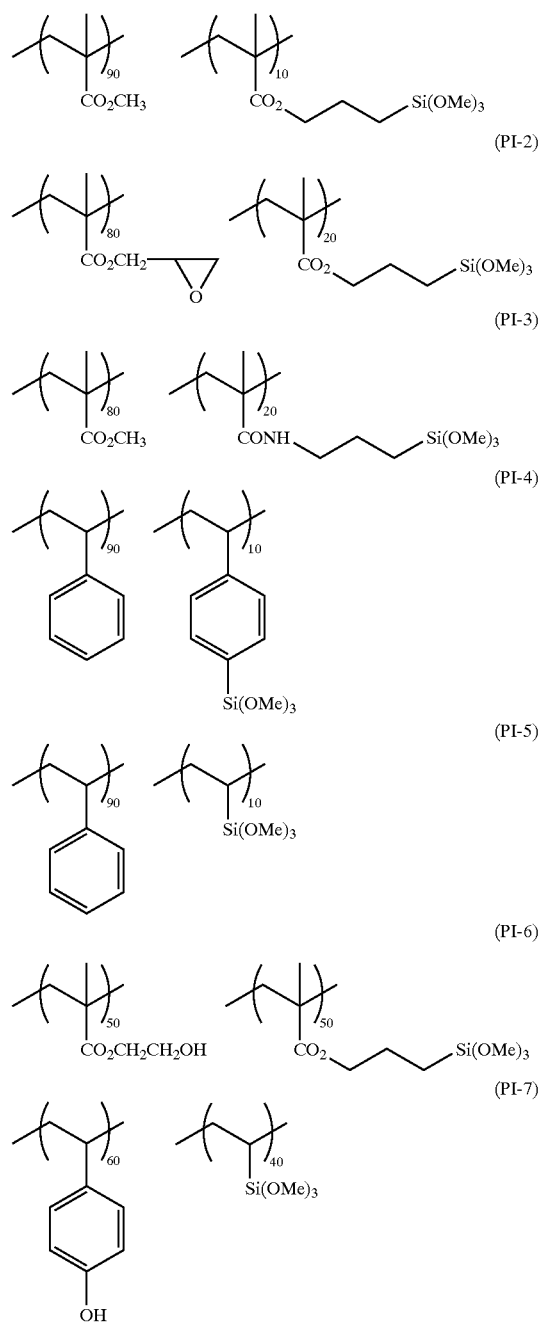

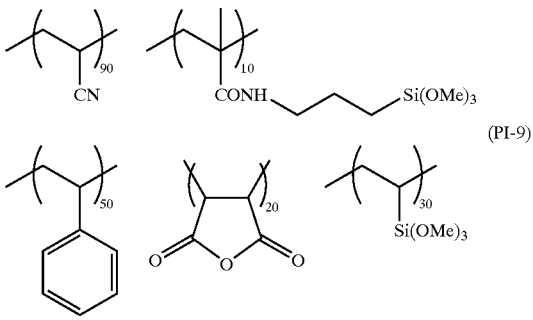

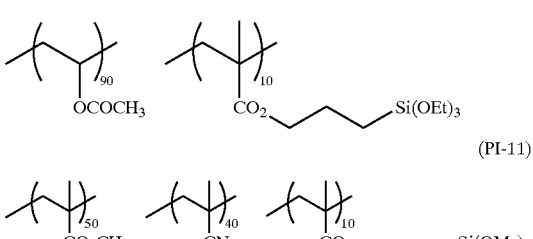

A content of the structural unit comprising an organic silicone group in a hydrophobic polymer to be used in the present invention is preferably 0.01 to 100 mol %, more preferably 0.05 to 90 mol %, the most preferably 0.1 to 80 mol %. If the content of the structural unit comprising an organic silicone group is less than 0.01 mol %, sufficient effects according to the present invention can not be obtained.

A solidification temperature having such a heat-reactive functional group is preferably 70° C. or more, and in view of stability with time, 100° C. or more is especially preferable.

As specific examples of the water-immiscible solvent in the present invention, any appropriate solvent which can dissolve a hydrophobic polymer and is immiscible with water such as chloromethane, dichloromethane, ethyl acetate, methylethylketone (MEK), trichloromethane, carbon tetrachloride, ethylene chloride, trichloroethane, toluene, xylene, cyclohexane and 2-nitropropane, can be practically used in the present invention. Among these solvents, as particularly useful solvents, dichloromethane and MEK may be exemplified. These solvents are also suitable for eliminating the solvent from particles in an oil layer by evaporation.

In the process for producing polymer fine particles of the present invention, as a first embodiment, fine particles of an oxide or hydroxide of at least one element selected from elements belonging to 2 to 15 groups of the periodic table are preferably used. Specific examples of preferable elements include magnesium, titanium, zirconium, vanadium, chromium, zinc, aluminum, silicon, tin and iron. Especially preferred are silicon, titanium, aluminum and tin.

Fine particles of the oxide or hydroxide of the above-described elements can be used as colloids of the oxide or the hydroxide. A particle diameter of fine particles is generally about 0.001 to 1 μm, preferably 5 to 40 nm, the most preferably 10 to 30 nm.

As these colloid dispersions, commercially available products of Nissan Kagaku Kogyo (Nissan chemical industry) can be used.

In the process for producing polymer fine particles of the present invention, in order to enhance dispersion stability, a water-soluble resin can be preferably used. As such a water-soluble resin, for example, may be exemplified polyvinyl alcohol (PVA), modified PVA such as carboxy-modified PVA, polyacrylamide and the copolymers thereof, polydimethylacrylamide, polyacrylacetamide, polyoxazoline, acrylic acid copolymers, polyvinylmethyl ether, vinylmethyl ether/maleic anhydride copolymer, polyvinyl pyrrolidone, vinyl acetate/crotonic acid copolymer, polyacrylic acid, water-soluble urethane resins, polyethylene glycol, polypropylene glycol, N-vinylcarboxylic amide polymer, and polyethylene imine.

In particular, polyvinyl alcohol (PVA), polyacrylamide, polydimethyl acrylamide, polyacryl acetamide, polyoxazoline, polyvinylmethyl ether, polyvinyl pyrrolidone, polyacrylic acid, polyethylene glycol and polyethylene imine are preferably used. In particular, resins having high hydrophilic property are preferable. A polyvinyl alcohol having a saponification degree of 95% or more is preferable.

Further, at least two kinds of the above-described water-soluble resins can be used in a mixture thereof.

The water-soluble resin to be used in the present invention especially preferably has a structural unit represented by the formula (II) or (III). Specific examples will be described below. However, the present invention is not limited thereto.

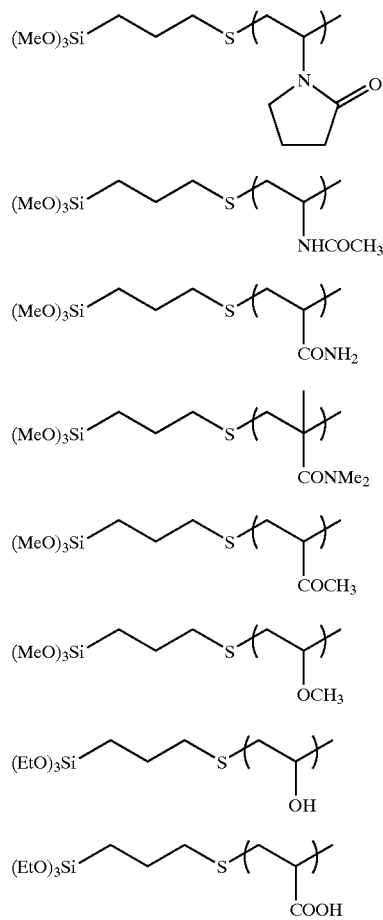

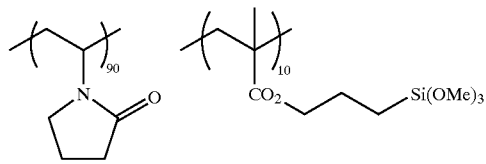

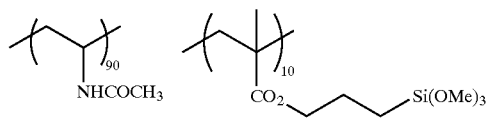

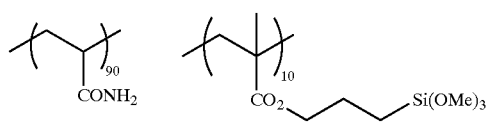

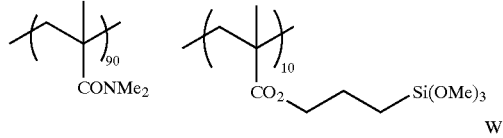

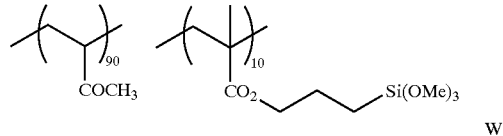

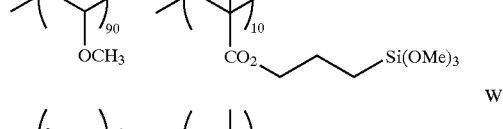

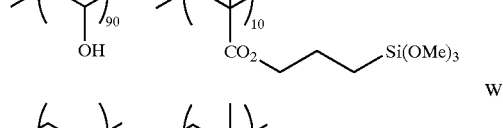

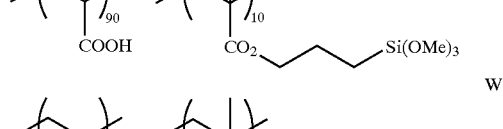

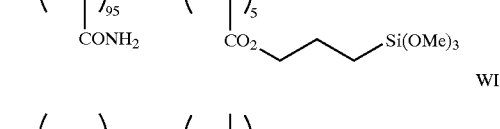

A content of the above-described water-soluble resin in polymer fine particles is appropriately 1 to 25% by weight, preferably 2 to 15% by weight.

In the production process of polymer fine particles of the present invention, in order to accelerate the hydrolysis or polycondensation of an organic silicon group of a polymer represented by formula (I), (II) and (III), an acidic catalyst or a basic catalyst can be used.

A kind of the acidic catalyst or the basic catalyst is not particularly limited. However, in a case where a high concentration catalyst is required to be used, a catalyst made of elements which do not substantially remain after producing fine particles is preferably used.

Specifically, as the acidic catalyst, may be exemplified hydrogenhalides such as hydrochloric acid, nitric acid, sulfuric acid, sulfurous acid, hydrogen sulfide, perchloric acid, hydrogen peroxide, carboxylic acids such as carbonic acid, formic acid and acetic acid, substituted carboxylic acids wherein R of the structural formula RCOOH is substituted, and sulfonic acids such as benzene sulfonate. While, as the basic catalyst, ammonia and amines such as ethylamine and aniline may be exemplified.

A catalyst is added to an aqueous phase as it is or as a solution of water or an alcohol.

A concentration of a catalyst to be added is not particularly limited. In a case where a catalyst concentration is high, hydrolysis or polycondensation is apt to be accelerated. However, if a basic catalyst having a high concentration is used, in some cases, precipitate may be formed in a dispersion. Therefore, the concentration of a basic catalyst is desirably 1 N or less.

As a surfactant to be used in the process for producing polymer fine particles of the present invention, may be exemplified, in addition to nonionic and anionic surfactants, cationic surfactants as described in JP-A-2-195356,fluorine-containing surfactants, amphoteric surfactants described in JP-A-59-12 1044 and JP-A-4-13 149.

Specific examples of the nonionic surfactant include polyoxyethylene alkylethers such as polyoxyethylene laurylether, polyoxyethylene stearylether, polyoxyethylene cetylether and polyoxyethylene oleylether; polyoxyethylene alkylarylethers such as polyoxyethylene nonylphenylether; polyoxyethylene/polyoxypropylene block copolymers; composite polyoxyalkylene alkylethers wherein to the terminal hydroxyl groups of polyoxyethylene/polyoxypropylene block copolymers are bonded aliphatic groups having 5 to 24 carbon atoms through ether linkages; composite polyoxyalkylene alkylarylethers wherein alkyl-substituted aryl groups are bonded similarly through ether linkages; sorbitan aliphatic acid esters such as sorbitan monolaurate, sorbitan monostearate, sorbitan tristearate, sorbitan monopalmitate, sorbitan monooleate and sorbitan trioleate; polyoxyethylene sorbitan aliphatic acid esters such as polyoxyethylene sorbitan monolaurate, polyoxyethylene sorbitan monopalmitate, polyoxyethylene sorbitan monostearate, polyoxyethylene sorbitan tristearate, and polyoxyethylene sorbitan trioleate.

Specific examples of the anionic surfactant include alkyl sulfonic acids, aryl sulfonic acids, aliphatic carboxylic acids, alkyl naphthalene sulfonic acids, condensed compounds of alkylnaphthalene sulfonic acids or naphthalene sulfonic acids with formaldehyde, aliphatic sulfonic acids having 9 to 26 carbon atoms, alkylbenzene sulfonic acids, polyoxyethylene-containing sulfuric acid and polyoxyethylene-containing phosphoric acid such as laurylpolyoxyethylene sulfuric acid, cetylpolyoxyethylene sulfonic acid and oleylpolyoxyethylene sulfonic acid.

Specific examples of the fluorine-containing surfactant include perfluoroalkyl carboxylates, pertluoroalkyl phosphates, perfluoroalkyl trimethylammonium salts, perfluoroalkyl betaines, perfluoroalkyl amineoxides and perfluoroalkyl EO adducts.

Specific examples of the fluorine-containing surfactant include perfluoroalkyl carboxylates, perfluoroalkyl phosphates, perfluoroalkyl trimethylammonium salts, perfluoroalkyl betains, perfluoroalkyl amineoxides and perfluoroalkyl EO adducts.

Specific examples of the amphoteric surfactant include alkylcarboxy betaines, alkylaminocarboxylic acids, alkyldi(aminoethyl)glycines, alkylpolyaminoethylglycine hydrochlorides, 2-alkyl-N-carboxyethyl-N-hydroxyethylimidazolinium betaines, and N-tetradecyl-N,N-betaine types (e.g., trade name, Amorgen K, produced by Daiichi Kogyo Co., Ltd.).

In an image-receiving layer, further a fluorine-based surfactant can be optionally used in such an amount as described in the addition amount of a surfactant. Specifically, is preferred a perfluoroalkyl group-containing surfactant. Further, may be exemplified anionic surfactants comprising either carboxylic acid, sulfonic acid, sulfuric acid ester or phosphoric acid ester; cationic surfactants such as aliphatic amines and quaternary ammonium salts; amphoteric surfactants such as betaine-based compounds; and nonionic surfactants such as aliphatic esters of polyoxy compounds, polyalkyleneoxide condensed based compounds and polyethyleneimine condensed based compounds.

In particular, anionic, nonionic and amphoteric surfactants are preferable. Specifically, may be exemplified polyoxyethylene alkylethers, polyoxyethylene alkylphenylethers, polyoxyethylene/polyoxypropylene block copolymers, alkyl sulfonic acids, aliphatic carboxylic acids, alkylbenzene sulfonic acids, polyoxyethylene-containing sulfuric acids, condensed compounds of alkyl-naphthalene sulfonic acids or naphthalene sulfonic acids with formaldehyde, alkylcarboxybetaines, and alkylaminocarboxylic acids.

As described hereinabove, by using a hydrophobic polymer and a water-soluble polymer having a specified organic silicon group, desirable polymer fine particles can be obtained. In a combination with a resin forming an image-recording layer, for example, a sol-gel conversion system binder resin, a silicon group can form a direct chemical bond with a binder resin matrix, owing to heat reactivity of the silicon group. Thus, can be formed a film excellent in mechanical strength and abrasion resistance. Also in an irradiated area of this light-sensitive layer which has been irradiated with laser beam to be hydrophobic, an uniform layer can be formed with similarly keeping a chemical bond with a binder resin and, therefore, an image area excellent in abrasion resistance can be formed.

The production of polymer fine particles using the above-described raw materials can be effected according to well-known procedure. Namely, an oil phase solution obtained by dissolving a hydrophobic polymer in a solvent immiscible with water, and an aqueous phase solution comprising fine particles of an oxide or a hydroxide of silica, or a water-soluble resin, and a surfactant are prepared and mixed, the resulting mixture is intensively stirred and mixed using an emulsification-dispersion machine such as homogenizer, for example, at 12,000 rpm for 10 to 15 minutes to emulsify and disperse oil droplets in an aqueous phase. Successively, the resulting emulsified dispersion is stirred with heating to evaporate the solvent thereby to obtain an aqueous dispersion of, object product, polymer fine particles.

Explanation regarding a lithographic printing plate precursor having an image-recording layer comprising polymer fine particles produced by the above-described method on a support will be provided below.

[Image Recording Layer]

A content of polymer fine particles produced according to the production method of the present invention in an image-recording layer is preferably 10 to 80% by weight, more preferably 20 to 60% by weight of a solid content of the image-recording layer. When the addition amount is less than 10% by weight, a light-irradiated area is insufficient in lipophilic property to be poor in an ink adhesion. While, over 80% by weight of polymer fine particles results in poor hydrophilic property, which may cause printing staining.

The polymer fine particles of the present invention are preferably dispersed in a hydrophilic binder resin in an image-recording layer. The hydrophilic binder resin is preferably a hydrophilic polymer binder resin or a hydrophilic sol-gel conversion system binder resin. Among these binder resins, as a binder resin having a high hydrophilic property and being able to be resistant to a destruction of the image-recording layer due to a heat reaction, a sol-gel conversion system binder resin having a property of forming a gel structure of polysiloxane is preferable.

Specific examples of the hydrophilic binder resin include water-soluble resins, e.g., gum arabic, polyvinyl alcohol (PVA) s, starch and derivatives thereof, cellulose derivatives such as carboxymethyl cellulose and the sodium salt thereof, hydroxyethyl cellulose and cellulose acetate, sodium alginate, casein, gelatin, polyvinyl pyrrolidone, vinyl acetate/maleic acid copolymer, styrene-maleic acid copolymer, alginic acid and alkali metal salts thereof, alkali earth metal salts or ammonium salts, polyacrylic acid and salts thereof, polymethacrylic acid and salts thereof, poly (ethylene oxide), water-soluble urethane resin, water-soluble polyester resin, homopolymers and copolymers of hydroxyethyl acrylate, homopolymers and copolymers of hydroxyethyl methacrylate, homopolymers and copolymers of hydroxypropyl acrylate, homopolymers and copolymers of hydroxypropyl methacrylate, homopolymers and copolymers of hydroxybutyl acrylate, homopolymers and copolymers of hydroxybutyl methacrylate, polyethylene glycol diacrylate based polymers, homopolymers and copolymers of hydroxypropyl methacrylate, polyethylene glycols, and poly(hydroxypropylene)s.

The above-described hydrophilic resin is preferably used by crosslinking the same. In such a case, as a water-resisting agent for hardening a resin, may be exemplified aldehydes such as glyoxal, melamine-formaldehyde resin, and urea-formaldehyde resin; methylol compounds such as N-methylol urea, N-methylol melamine and methylol polyamide resin; active vinyl compounds such as divinyl sulfone and bis(β-hydroxyethyl sulfonic acid); epoxy compounds such as epichlorohydrin, polyethylene glycol diglycidyl ether, polyamide/polyamine/epichlorohydrin adduct and polyamide/epichlorohydrin resin; ester compounds such as monochloroacetic acid ester and thioglycolic acid ester; polycarboxylic acids such as polyacrylic acid and methylvinyl ether/maleic acid copolymerized products; inorganic crosslinking agents such as boric acid, titanyl sulfonate, Cu, Al, Sn, V, Cr salts; modified polyamide polyirnide resins.

Additionally crosslinking catalysts such as ammonium chloride, silane coupling agents, titanate coupling agents can be used together.

An especially preferable binder for the image-recording layer of the present invention is a binder resin of a sol-gel conversion system. A system desirably applicable to the present invention wherein sol-gel conversion can be effected comprises a polymer product wherein linking groups from polyvalent element form a network structure through oxygen atoms, and, at the same time, polyvalent metals comprise unbonded hydroxyl groups and alkoxy groups which are present randomly to form a resinous structure. In a stage where alkoxy groups and hydroxyl groups are present in a large amount, the system is in a state of sol. While, with proceeding of dehydration reaction, the network resin structure is correspondingly to be stiff.

Examples of a polyvalent element of a compound having a hydroxyl group (s) and an alkoxy group (s) which can effect sol-gel conversion include aluminum, silicon, titanium and zirconium. They all can be used in the present invention. However, a sol-gel conversion system through a siloxane bond which can be most preferably used will be explained below. A sol-gel conversion using aluminum, titanium or zirconium can be effected by replacing respective metals with silicon which will be described below.

Namely, a system comprising a silane compound having at least one silanol group (s), which can effect sol-gel conversion, is especially preferably used.

A system utilizing sol-gel conversion will be further described below.

An inorganic hydrophilic binder resin formed by sol-gel conversion is a resin preferably having a siloxane bond(s) and a silanol group(s). The image-recording layer of the lithographic printing plate precursor of the present invention is formed by coating a coating solution in the state of sol comprising a silane compound having at least one silanol group(s) Specifically, after coating, hydrolysis condensation of the silanol group proceeds to form a siloxane skeleton structure so that gelation may proceed. Thus, the image-recording layer is formed.

A layer formed by this sol-gel conversion can be added with an organic hydrophilic polymer or a crosslinking agent in order to improve physical properties such as film strength and flexibility and also to improve coating property.

A siloxane resin forming gel structure is represented by the following formula (IV) and a silane compound having at least on silanol group(s) is represented by the following formula (V). Further, a material included in an image recording layer is not necessarily solely composed of a silane compound having the formula (V), but generally composed of an oligomer formed by a partial hydrolysis-polymerization of the silane compound or composed of a mixture of the silane compound and the oligomer thereof.

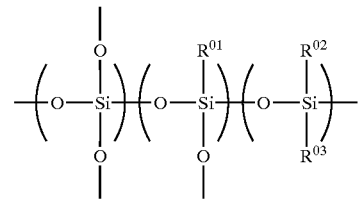

(IV)

A siloxane-derived resin having the above-described formula (IV) is formed by sol-gel conversion from a dispersion comprising at least one kind of silane compound(s) represented by the following formula (V). In formula (IV), at least one of $R^{01}$ to $R^{03}$ represents a hydroxyl group, the other groups represent organic residues selected from $R^0$ and Y in the following formula (IV).

$$(R^0)_n Si(Y)_{4-n} \qquad (v)$$

wherein $R^0$ represents a hydroxyl group, a hydrocarbon group or a hetero-ring group; Y represents a hydrogen atom, a halogen atom, —$OR^{11}$, —$OCOR^{12}$ or —$N(R^{13})(R^{14})(R^{11}$, $R^{11}$ each represents a hydrocarbon group, $R^{13}$ and $R^{14}$ may be the same or different, and represent a hydrogen atom or a hydrocarbon group), n represents 0, 1, or 3.

A hydrocarbon group or a hetero-ring group represented by $R^0$ in formula (IV) represents, for example, a straight-chain or branched-chain alkyl group having 1 to 12 carbon atoms, which may be substituted [e.g., methyl, ethyl, propyl, butyl, pentyl, hexyl, heptyl, octyl, nonyl, decyl and dodecyl (as a group to be substituted with these groups, may be exemplified a halogen atom (chlorine atom, fluorine atom, bromine atom), hydroxyl, thiol, carboxyl, sulfo, cyano, epoxy, —OR' (R' represents methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N, N-dimethylaminoethyl, 2-bromoethyl, 2-(2-methoxyethyl) oxyediyl, 2-methoxycarbonylethyl, 3-carboxypropyl, benzyl), —OCOR', —COOR', —COR', —N(R")(R") (R" represents a hydrogen atom or has the same meaning as that of the above-described R', and R"s may be the same or different), —NHCONHR', —NHCOOR', —Si(R')$_3$, —CONHR", and —NHCOR', these substituents may be substituted with alkyl groups in plural numbers]; a straight-chain or branched-chain alkenyl group having 2 to 12 carbon atoms, which may be substituted (e.g., vinyl, propeny, butenyl, pentenyl, hexenyl, octenyl, decenyl and dodecenyl, the substituents of these groups are the same as those substituted with the above-described alkyl groups); an aralkyl group having 7 to 14 carbon atoms, which may be substituted (e.g., benzyl, phenethyl, 3-phenylpropyl, naphthylmethyl and 2-naphthylethyl, the substituents of these groups are the same as those substituted with the above-described alkyl groups, and plural number of groups can be substituted); an alicyclic group having 5 to 10 carbon atoms, which may be substituted (e.g., cyclopentyl, cyclohexyl, 2-cyclohexylethyl, 2-cyclopentylethyl, norbornyl and adamantyl, the substituents of these groups are the same as substituents in the above-described alkyl groups, and plural number of groups can be substituted); an aryl group having 6 to 12 carbon atoms, which may be substituted (e.g., a phenyl and naphthyl group, the substituents of these groups are the same as those substituted with the above-described alkyl groups, and plural number of groups can be substituted); a hetero ring group comprising at least one kind of atom(s) selected from the group consisting of a nitrogen atom, an oxygen atom and a sulfur atom, which may be condensed (Examples of the hetero ring include pyran, furan, thiophene, morpholine, pyrrole, thiazole, oxazole, pyridine, piperidine, pyrrolidone, benzothiazole, benzoxazole, quinoline, and tetrahydrofuran, which can be substituted, the substituents of these groups are the same as those substituted with the above-described alkyl groups, and plural number of groups can be substituted).

Substituents of —OR$^{11}$, —OCOR$^{12}$ or —N(R$^{13}$)(R$^{14}$) of Y in formula (V) are, for example, as follows.

In —OR$^{11}$, R$^{11}$ represents an aliphatic group having 1 to 10 carbon atoms, which may be substituted (e.g., methyl, ethyl, propyl, butyl, heptyl, hexyl, pentyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxo)ethyl, 2-(N,N-dimethylamino)ethyl, 2-methoxypropyl, 2-cyanoethyl, 3-methyloxapropyl, 2-chloroethyl, cyclohexyl, cyclopentyl, cyclooctyl, chlorocyclohexyl, methoxycyclohexyl, benzyl, phenethyl, dimethoxybenzyl, methylbenzyl and bromobenzyl).

In —OCOR$^{12}$, R$^{12}$ represents the same aliphatic groups as those of R$^{11}$ or an aromatic group having 6 to 12 carbon atoms, which may be substituted (As the aromatic group, the same groups as those exemplified in the aryl group in the above-described R may be exemplified).

In —N(R$^{13}$)(R$^{14}$), R$^{13}$ and R$^{14}$ may be the same or different, and each represents a hydrogen atom or an aliphatic groups having 1 to 10 carbon atoms, which may be substituted (As the aliphatic group, the same groups as those exemplified in the R$^{11}$ of the above-described —OR$^{11}$ group may be exemplified).

Preferably, the sum of the carbon number of R$^{13}$ and R$^{14}$ is 16 or less.

Specific examples of a silane compound represented by formula (V) include the following groups. However, the present invention is not limited thereto.

Namely, may be exemplified tetrachlorosilane, tetramethoxysilane, tetraethoxysilane, tetraisopropoxysilane, tetra-n-propylsilalle, methyltrichlorosilane, methyltrimethoxysilane, methyltriethoxysilane, ethyltrichlorosilane, ethyltrimethoxysilane, ethyltriethoxysilane, n-propyltrichlorosilane, n-propyltribromosilane, n-propyltrimethoxysilane, n-propyltriethoxysilane, n-decyltrimethoxysilane, n-hexyltrichlorosilane, n-hexyltrimethoxysilane, phenyltrichlorosilane, phenyltrimethoxysilane, phenyltriethoxysilane, dimethoxydiethoxysilane, dimethyldichlorosilane, dimethyldimethoxysilane, dimethyldiethoxysilane, diphenyldiethoxysilane, phenylmethyldimethoxysilane, triethoxyhydroxysilane, trimethoxyhydroxysilane, vinyltrichlorosilane, vinyltrimethoxysilane, trifluoropropyltrichlorosilane, trifluoropropyltrimethoxysilane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-methacryloylpropylmethyltrimethoxysilane, γ-methacryloxypropyltri-t-butoxysilane, γ-aminopropylmethyldimethoxysilane, γ-aminopropylmethyldiethoxysilane, γ-aminopropyltriethoxysilane, γ-mercaptopropylmethyldimethoxysilane, γ-mercaptopropylmethyldiechoxysilane, γ-mercaptopropyltrimethoxysilane, γ-mercapcopropyltriethoxysilane, and β-3,4-epoxycyclohexyl)ethyltrimethoxysilane.

Can be used a compound of a metal such as Ti, Zn, Sn, Zr and Al, which is bonded to a resin in sol-gel conversion to be able to form a film, together with a silane compound represented by formula (V) to be used for forming an inorganic hydrophilic binder resin in the hydrophilic layer of the present invention.

As a metal compound to be used, for example, may be exemplified Ti(OR$^{15}$)$_4$ (R$^{15}$ represents methyl, ethyl, propyl, butyl, pentyl and hexyl), TiCl$_4$, Zn(OR$^{15}$)$_2$, Zn(CH$_3$COCHCOCH$_3$)$_2$, Sn(OR$^{15}$)$_4$, Sn(CH$_3$COCHCOCH$_3$)$_4$, Sn(OCOR$^{15}$)$_4$, SnCl$_4$, Zr(OR$^{15}$)$_4$, Zr(CH$_3$COCHCOCH$_3$)$_4$, Al(OR$^{15}$)$_3$ and Al(CH$_3$COCHCOCH$_3$)$_3$.

Further, in order to accelerate the hydrolysis and polycondensation of a silane compound represented by formula (V) and the above-described metal compound to be used together, it is preferable to use an acidic catalyst or a basic catalyst in combination therewith.

As the catalyst, an acidic compound or a basic compound is used as it is, or an aqueous solution or an alcohol solution thereof (hereinafter, each referred to as an acidic catalyst or a basic catalyst) is used. The concentration of a catalyst is not particularly limited. However, in a case where a catalyst concentration is high, hydrolysis and polycondensation is apt to be accelerated. It is noted, however, when a basic catalyst having a high concentration is used, sometimes precipitation is formed in a sol solution and, therefore, the concentration of the basic catalyst is desirably 1 N (converted to a concentration in an aqueous solution) or less.

A kind of an acidic catalyst or a basic catalyst is not particularly limited. However, in a case where a high concentration catalyst is required to be used, a catalyst composed of elements which substantially do not remain in catalyst crystal particles having been subjected to sintering is preferable. Specifically, as the acid catalyst, may be exemplified hydrogen halides such as hydrochloric acid, nitric acid, sulfuric acid, sulfurous acid, hydrogen sulfide, perchloric acid, hydrogen peroxide, carboxylic acids such as carbonic acid, formic acid and acetic acid, substituted carboxylic acids wherein R of the structural formula RCOOH is substituted with another element or a substituent, and sulfonic acids such as benzene sulfonate. While, as the basic catalyst, ammonia bases such as aqueous ammonia, and amines such as ethylamine and aniline may be exemplified.

As described hereinabove, an image-recording layer produced by a sol-gel method is especially preferable for the lithographic printing plate precursor of the present invention. The further details of the above-described sol-gel method are described in "sol gel hou no kagaku (Science of sol-gel method)" written by Sumio Sakuhana, published by Agune Shoufusha Co., Ltd., 1988; and "Saishin sol-gel houniyoru kinouseihakumaku sakusei gijutsu (Functional film formation technique according to recent sol-gel method)" written by Hirashima, published by Sougou Gijutsu Center (Total technique center), 1992.

In the image-recording layer of the lithographic printing original sheet of the present invention, in addition to polymer fine particles and a hydrophilic binder, can be added a light-to-heat converting agent which generates heat upon absorbing light and other various compounds for achieving various objects, e.g., inorganic fine particles, surfactants and colorants for improving sensitivity, controlling the degree of hydrophilic property, improving physical strength of the image-recording layer, improving mutual dispersibility of compositions constituting a layer, improving coating ability, improving printability and convenience in a plate-making workability. Regarding these additives, explanation will be described below.

As the light-to-heat converting agent, metal and metal oxide particles, pigment particles, and dyes are preferable. As the metal and metal oxide particles, can be used metals which are selected from the group consisting of Al, Si, Ti, V, Cr, Mn, Fe, Co, Ni, Cu, Zn, Y, Zr, Mo, Ag, Au, Pt, Pd, Rh, In, Sn and W, or metal oxides thereof, which are particulated to be able to be dispersed in a binder resin of the image-recording layer.

Especially preferred are metal fine particles of iron, silver, platinum, gold and palladium.

Additionally, TiOx (x=1.0 to 2.0), SiOx (x=0.6 to 2.0), AlOx (x=1.0 to 2.0), and metal azide compounds such as azides of copper, silver and tin are also preferable.

The above-described respective metal oxides, nitrides and sulfides are all obtained by a well-known production method. Many of them are commercially available as titanium black, iron black, molybdenum red, emerald green, cadmium red, cobalt blue, Prussian blue and ultramarine blue.

In addition to the above-described metal compounds and metals, nonmetallic particles made of a single substance such as carbon black, graphite and bone black, and various kinds of organic and inorganic pigments also can be included in the image-recording layer as light-to-heat convertible fine particles. Further, a light-to-heat convertible dye which does not have a particle form also can be added to the image-recording layer.

A dye to be included as a light-to-heat converting agent in the image-recording layer has a light absorption region in an optical wavelength region of an irradiated light and also has a light absorption region in an optical wavelength region of a solid particulate pigment dispersible in a binder resin and an irradiated light. Further, the dye is a molecular-dispersible one which can or cannot dye to a binder resin. A preferable solid particulate dyeing and molecular-dispersible dye is an IR (infrared ray) absorbing agent. Specifically, may be exemplified dyes selected from the group consisting of polymethine dye, cyanine dye, squarylium dye, pyrylium dye, diimmonium dye, phthalocyanine compound, triarylmethane dye, and metallic dithiolene. Of these dyes, more preferred are polymethine, dye, cyanine dye, squarylium dye, pyrylium dye, diimmonium dye and phthalocyanine compound.

In particular, in view of synthesis suitability, polymethine dye, cyanine dye, and phthalocyanine compound are most preferable. The above-described dyes can be water-soluble dyes having water-soluble groups inside the molecules. As preferable water-soluble groups of water-soluble dyes, a sulfonic group, a carboxyl group and a phosphonic group may be exemplified.

Specific examples of dyes to be used as light-to-heat converting agents included in image-recording layers (infrared absorber) are shown below. However, the present invention is not limited thereto.

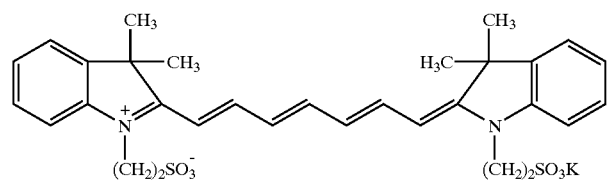

(IR-1)

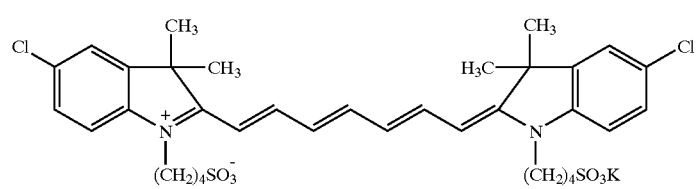

(IR-2)

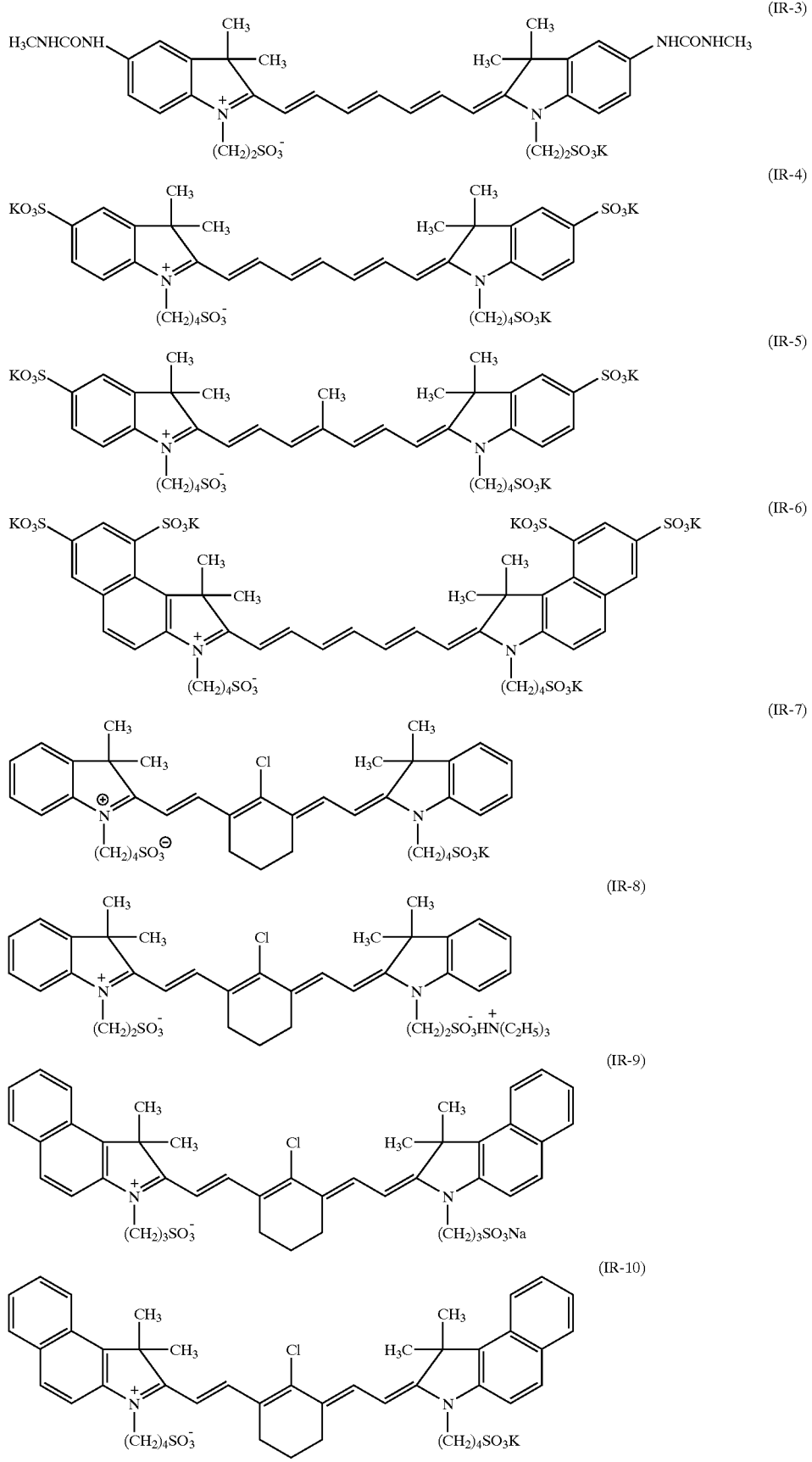

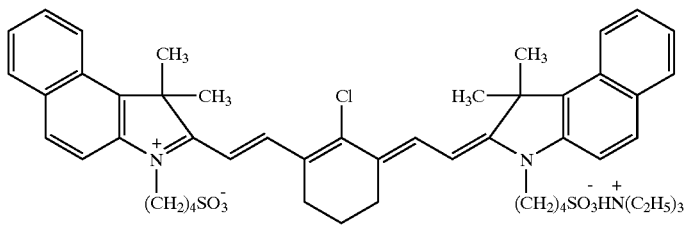

(IR-11)

An addition of a light-to-heat converting agent to the image-recording layer can be effected by adding the above-described light-to-heat converting agent to a coating solution of the image-recording layer. Alternatively, such addition can be effected in such a manner that the light-to-heat converting agent is included in hydrophobic polymer fine particles. Namely, the light-to-heat converting agent is preferably added to an oil phase component in producing polymer fine particles, and emulsified and dispersed, whereby the light-to-heat converting agent can be included in the polymer fine particles. Thus, the light-to-heat converting agent can be included in the polymer fine particles. In such a case, although the above-described light-to-heat converting agent can be used, it is desirable to use a lipophilic light-to-heat converting agent having a good affinity with a hydrophobic polymer. Such a lipophilic light-to-heat converting agent will be exemplified below. However, the present invention is not limited thereto.

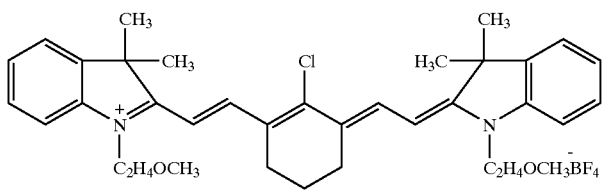

(IR-21)

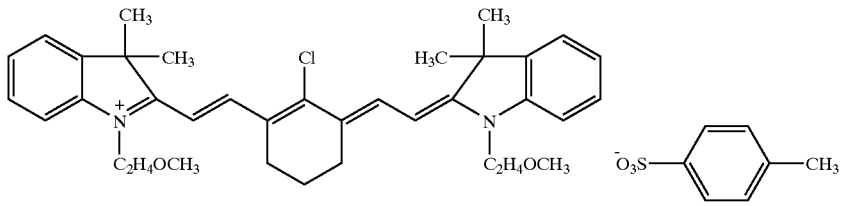

(IR-22)

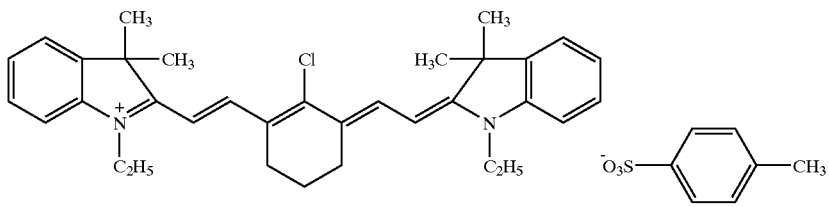

(IR-23)

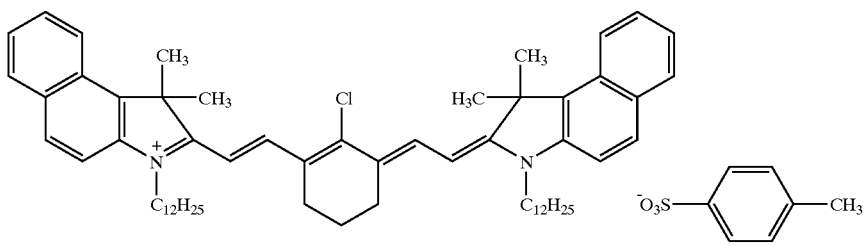

(IR-24)

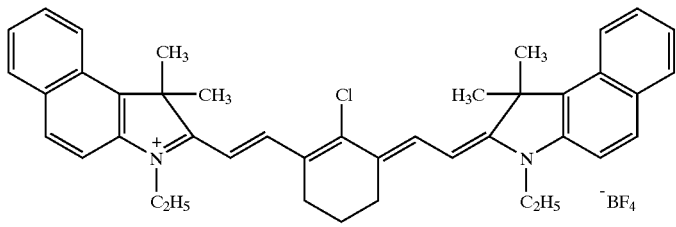

(IR-25)

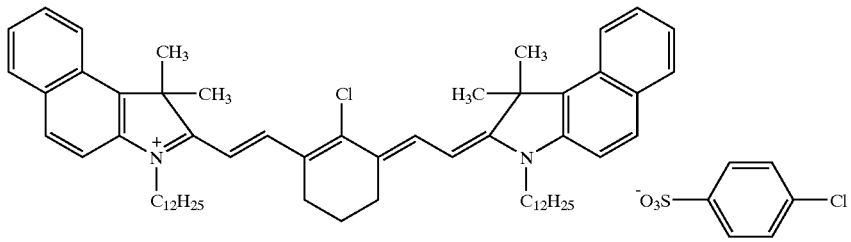

(IR-26)

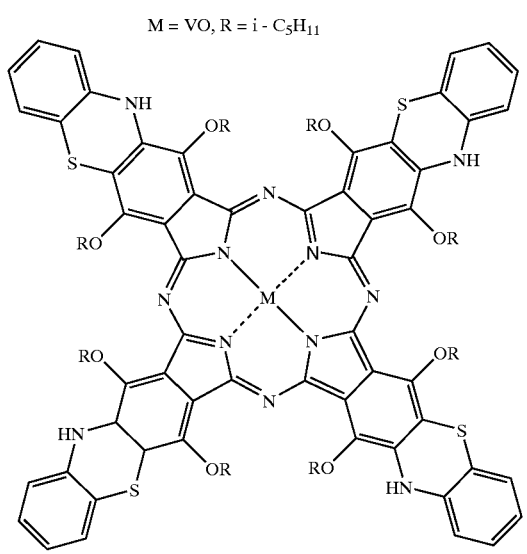

(IR-27)

M = VO, R = i - C₅H₁₁

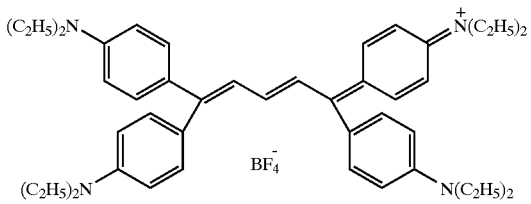

(IR-28)

A light-to-heat converting agent is included in an image-recording layer in such an amount that the surroundings of polymer fine particles may cause heat-fusion with heat generated by light-absorption by the light-to-heat converting agent to be hydrophobic. The content of the light-to-heat converting agent can be widely selected in a range of 2 to 50% by weight of an amount of a solid constituent component. If the content is less than 2% by weight, generated heat is insufficient so that the image-recording layer is to have a decreased sensitivity. On the other hand, if it is more than 50% by weight, a film strength is decreased.

Inorganic fine particles also can be added to the image-recording layer of the present invention. As the inorganic fine particles, may be exemplified silica, alumina, magnesium oxide, titanium oxide, magnesium carbonate, calcium alginate or the mixture thereof, as preferable examples. They can be used, although they are not light-to-heat convertible, for strengthening a film and interface adhesion by roughening a surface.

An average particle diameter of the inorganic fine particle is preferably 5 nm to 10 μm, more preferably 10 nm to 1 μm. The inorganic fine particles having a particle diameter within the above-described range can be stably dispersed in a binder resin together with polymer fine particles and metallic fine particles of a light-to-heat converting agent to be able to sufficiently keep a film strength of the image-recording layer and also to be able to form a non-image area excellent in hydrophilic property which is less apt to cause printing staining.

Such inorganic fine particles are readily commercially available as a colloidal silica dispersion.

A content of the inorganic fine particles in the image-recording layer is preferably 1.0 to 70% by weight, more preferably 5.0 to 50% by weight of the total solid content of the image-recording layer.

As a surfactant to be used in the image-recording layer, the same surfactants as those can be used in the production of polymer fine particles can be used.

In the image-recording layer, in some cases, specifically a surfactant having a perfluoroalkyl group is preferably used. Further, may be exemplified anionic surfactants having either a carboxylic acid, a sulfonic acid, a sulfuric acid ester or phosphoric acid ester; cationic surfactants such as an aliphatic amine and a quaternary ammonium salt; betaine based amphoteric surfactants; and nonionic surfactants such as an aliphatic ester of a polyoxy compound, a polyalkyloxide condensed based compound and a polyethyleneimine condensed based compound.

A content of the above-described surfactant in the image-recording layer is preferably 0.05 to 15% by weight, more preferably 0.1 to 5% by weight.

In the image-recording layer of the present invention, after forming an image, in order to readily distinguish an image area from non-image area, a dye having a high absorption in a visible light area can be used as a colorant of an image. Specifically, may be exemplified oil yellow #101, oil yellow #103, oil pink #312, oil green BG, oil blue BOS, oil blue #603, oil black BY, oil black BS, oil black T-505 (These dyes are produced by Orient Kagaku Kogyo (Orient Chemical Industry) Co., Ltd.), victoria pure blue, crystal violet (CI42555), methyl violet (CI42535), ethyl violet, rhodamine B (CI145170B), malachite green (CI42000), methylene blue (CI52015), and dyes described in JP-A-62-293247. Further, pigments such as aphthalocyanine pigment, an azo pigment and titanium oxide can be suitably used. An addition amount thereof is 0.01 to 10% by weight of the total solid content of the image-recording layer.

[Heat Insulating Layer]

In the lithographic printing plate precursor, a heat-insulating layer, although not essential, is preferably provided between the support and the image-recording layer. Regarding the heat-insulating layer, the explanation will be provided below.

A heat-insulating layer provided as the lower layer of the image-recording layer has a low heat conductivity and, therefore, has a function of suppressing diffusion of heat to the support. A light-to-heat converting agent further can be included in the heat-insulating layer. In such a case, light-irradiation causes heat generation, which contributes to the improvement in heat-fusion sensitivity.

Such a heat-insulating layer is composed of an organic or inorganic resin.

The organic or inorganic resin can be widely selected from hydrophilic or hydrophobic resins. For example, as the hydrophobic resin, may be exemplified polyethylene, polypropylene, polyester, polyamide, acryl resin, vinyl chloride resin, vinylidene chloride resin, polyvinyl butyral resin, nitrocellulose, polyacrylate, polymethacrylate, polycarbonate, polyurethane, polystyrene, vinyl chloride resin-vinyl acetate copolymer, vinyl chloride-vinyl acetate-vinyl alcohol copolymer, vinyl chloride-vinyl resin-maleic acid copolymer, vinyl chloride-acrylate copolymer, polyvinylidene chloride, and vinylidene chloride-acrylonitrile copolymer.

In the present invention, as a resin having hydrophobic property, can be used those formed from an aqueous emulsion. The aqueous emulsion means a hydrophobic polymer-suspended solution obtained by dispersing particles comprising polymer fine particles and, optionally, a protecting agent which disperses and stabilizes the fine polymer particles in water.

Specific examples of the aqueous emulsion to be used include vinyl-based polymer latex (polyacrylate-based, vinyl acetate-based and ethylene-vinyl acetate-based), conjugated diene-basedpolymer latex (methylmethacrylate-butadiene-based, styrene-butadiene-based, acrylonitrile-butadiene-based and chloroprene-based) and polyurethane resin.

Next, as the resin having hydrophilic property, specifically, may be exemplified polyvinyl alcohol (PVA), modified PVAs such as carboxy-modified PVA; starch and derivatives thereof; cellulose derivatives such as carboxymethyl cellulose and hydroxyethyl cellulose; animonium alginate, water-soluble resins such as polyacrylic acid, polyacrylic acid salt, polyethylene oxide, water-soluble urethane resin, water-soluble polyester resin, polyhydroxyethyl acrylate, polyethylene glycol diacrylate-based polymer, N-vinylcarboxylic amide polymer, casein, gelatin, polyvinylpyrrolidone, vinyl acetate-crotonic acid copolymer, and styrene-maleic acid copolymer.

The product obtained by crosslinking the above-described resin having hydrophilic property to be hardened is preferably used. As a crosslinking agent (also referred to as water-resisting agent), the same water-resisting agents as those used in the image-recording layer as described above can be used.

Further, as the inorganic polymer, an inorganic matrix formed by sol-gel conversion is preferable. A system desirably applicable to the present invention wherein sol-gel conversion can be effected comprises a polymer product wherein linking groups bonded with polyvalent element form a network structure through oxygen atoms, and, at the same time, polyvalent metals comprise unbonded hydroxyl groups and alkoxy groups which are present randomly to form a resinous structure. In a stage where alkoxy groups and hydroxyl groups are present in a large amount, the system is in a state of sol. While, with proceeding of dehydration reaction, the network resin structure is correspondingly to be stiff. In addition to the property which varies hydrophilic degree of a resin structure, the inorganic polymer further has such a function that the surface of solid fine particles is modified by linking a part of hydroxyl groups thereof with the solid fine particles to vary the hydrophilic degree. Examples of a polyvalent element of a compound having a hydroxyl group(s) and an alkoxy group (s) which can effect sol-gel conversion include aluminum, silicon, titanium and zirconium. They all can be used in the present invention.

In view of adhesion with an image-recording layer, among these resins, especially hydrophilic resins are preferable.

In a case where a light-to-heat converting agent is included in a heat-insulating layer, as the light-to-heat converting agent, the same materials as the above-described light-to-heat converting agents used in the image-recording layer can be used.

The content of the light-to-heat converting agent included in the heat-insulating layer can be widely selected in a range of 2 to 95% by weight of an amount of a solid constituent component. If the content is less than 2% by weight, generated heat is insufficient so that effects obtained by the addition is not noticeable. On the other hand, if it is more than 95% by weight, a film strength is decreased.

In the heat-insulating layer, in addition to the above-described resin and light-to-heat converting agent, can be added compounds such as inorganic fine particles and surfactants for achieving various purposes such as for improving the physical strength of the heat-insulating layer, dispersibility of mutual compositions constituting the layer, coating property, and adhesion with the image-recording layer.

An inorganic fine particles to be added to the heat-insulating layer, the same inorganic fine particles as those to be added to the image-recording layer as described above can be added and as a result, similar effects to those as described above can be achieved.

An amount of the inorganic fine particles to be added to the heat-insulating layer is the same amount range as that in case of adding to the image-recording layer.

Those described to be able to be added to the image-recording layer also can be used in the heat-insulating layer. The addition amounts are also the same as those described regarding the image-recording layer.

[Water-soluble Protecting Layer]

Since the surface of the lithographic printing plate precursor of the present invention is hydrophilic, a water-soluble protecting layer is liable to be hydrophobic by the influence from the surrounding atmosphere, susceptible to the influence of a temperature and a humidity and also influences such as a mechanical damage or staining, while the printing plate precursor is transported or stored in the form of a finished product, or in handling the printing plate precursor prior to utilization. Accordingly, in the lithographic printing plate precursor, a water-soluble surface protecting layer mainly comprising a water-soluble polymer is desirably provided in order to prevent the above-described influences. However, the surface protecting layer is not essential for the present invention.

The water-soluble protecting layer is dissolved in dampening water to be washed away in the initial stage of printing. Thus, a particular procedure for eliminating the protecting layer is not necessitated and, therefore, the protecting layer does not cause any problem for printing.

Components to be included in the water-soluble protecting layer will be described below.

A water-soluble polymer to be included in the water-soluble protecting layer functions as a binder resin of the water-soluble layer. As the water-soluble polymer, for example, a polymer sufficiently comprising groups such as a hydroxyl group, a carboxyl group and a basic nitrogen-containing group may be exemplified.

Specifically, may be exemplified polyvinyl alcohol (PVA), modified PVAs such as carboxy-modified PVA, gum arabic, water-soluble soybean polysaccharides, polyacrylamide and copolymers thereof, acrylic acid copolymers, vinylmethyl ether/maleic anhydride copolymer, vinyl acerare/maleic anhydride copolymer, styrene/maleic anhydride copolymer, roasted dextrin, oxygen-decomposed dextrin, oxygen-decomposed etherified dextrin, starch and derivatives thereof, cellulose derivatives such as carboxymethyl cellulose, carboxyethyl cellulose, methyl cellulose and hydroxyethyl cellulose, casein, gelatin, polyvinylpyrrolidone, vinyl acetate-croronic acid copolymer, styrene-maleic acid copolymer, alginic acid and alkali metal salts thereof, alkali earth metal salts or ammonium salts thereof, polyacrylic acid, poly(ethylene oxide), water-soluble urethane resin, water-soluble polyester resin, polyhydroxethyl acrylate, polyethylene glycol, polypropylene glycol, and N-vinylcarboxylic amide polymer.

In particular, polyvinyl alcohol (PVA), modified PVAs such as carboxy-modified PVA, gum arabic, polyacrylamide, polyacrylic acid, acrylic acid copolymer, polyvinyl pyrrolidone, alginic acid and alkali metal salts thereof are preferably used.

A content of the above-described water-soluble resin in a coating solution is appropriately 3 to 25% by weight, preferably 10 to 25% by weight.

It is noted that in the present invention, at least two kinds of the above-described water-soluble resins may be used as a mixture thereof.

As other components of the water-soluble protecting layer, various surfactants can be used. As usable surfactants, anionic and nonionic surfactants may be exemplified.

The same surfactants as those used in the above-described polymer fine particle production can be used. A content of the surfactant is preferably 0.01 to 1% by weight, more preferably 0.05 to 0.5% by weight of the total solid content of the water-soluble layer.

In addition to the above-described components, optionally, as a wetting agent, lower polyvalent alcohols such as glycerol, ethylene glycol and triethylene glycol can be used. The wetting agent is used appropriately in an amount of 0.1 to 5.0% by weight, preferably 0.5 to 3.0% by weight in the surface protecting layer. In addition to the above-described components, in the coating solution of the surface protecting layer of the lithographic printing plate precursor of the present invention, a preservative can be added. For example, benzoic acid and the derivatives thereof, phenol, formalin, sodium dehydroacetate can be added in an amount of 0.005 to 2.0% by weight.

An antifoamer also can be added to the coating solution. Examples of preferable antifoamer include an organic silicon compound, and an addition amount of the same is preferably in a range of 0.0001 to 0.1% by weight.

Further, a light-to-heat converting agent can be added to a water-soluble protecting layer. In this case, since the sensitivity of heat-fusion by irradiating light to an image-recording layer is further enhanced, desirable results can be obtained. As the light-to-heat converting agent, the above-described light-to-heat converting agents which are described to be able to be added to a heat-insulating layer can be used in the same amount range as that described above in the heat-insulating layer.

[Coating]

The above-described image-recording layer, heat-insulating layer and protecting layer are formed by respectively coating each coating solution obtained by mixing constituent components of respective layers according to a conventionally known coating method, followed by drying.

As a method for coating, well-known various methods can be used. For example, may be exemplified bar coater coating, rotating coating, spraying coating, curtain coating, dip coating, air knife coating, blade coating and roll coating.

A coating amount of an image-recording layer obtained after coating and drying (solid content) differs depending upon an object for use. However, regarding a common lithographic printing plate precursor, a coating amount is preferably 0.1 to 30 g/m$^2$, more preferably 0.3 to 10 g/m$^2$.

A coating amount of a heat-insulating layer (solid content) also differs depending upon the construction of a lithographic printing plate precursor. However, regarding a common lithographic printing plate precursor, a coating amount is preferably 0.1 to 10 g/m$^2$, more preferably 0.3 to 5 g/m$^2$.

A coating amount of a protecting layer (solid content) also differs depending upon the construction of a lithographic printing plate precursor. However, regarding a common lithographic printing plate precursor, a coating amount is preferably 0.1 to 5 g/m$^2$, more preferably 0.2 to 3 g/m$^2$.

Generally, coating is effected in the order of a heat-insulating layer, an image-recording layer and a protecting layer.

[Support]

Next, a description will be made regarding a support on which an image-recording layer is provided by coating.

As the support, a material in the form of plate having a stable dimension is used. Examples of the support to be used in the present invention include a paper, a paper laminated with plastic (e.g., polyethylene, polypropylene and polystyrene), a metal plate (e.g., aluminum, zinc, lead, copper, nickel and stainless steel), plastic film (e.g., cellulose diacetate, cellulose triacetate, cellulose propionate, cellulose butyrate, cellulose acetate butyrate, cellulose nitrate, polyethylene tereplnhalate, polyethylene, polystyrene, polypropylene, polycarbonate and polyvinyl acetal), and a paper or a plastic film on which the above-described metal is laminated or vapor-deposited.

As a preferable support, a polyester film, an aluminum plate or a SUS steel plate which is less apt to be corroded on a printing plate may be exemplified. Of these, an aluminum plate having a stable dimension and which is relatively inexpensive is preferable.

A preferable aluminum plate is a pure aluminum plate and an alloy plate mainly comprising aluminum, and also including a micro amount of a foreign element. Also can be used a plastic film on which aluminum is laminated or vapor-deposited. Examples of a foreign element included in an aluminum alloy include silicon, iron, manganese, copper, magnesium, chromium, zinc, bismuth, nickel and titanium. A content of a foreign element in an alloy is at most 10% by weight or less. In the present invention, an especially preferable aluminum is pure aluminum. However, completely pure aluminum is difficult to be produced in view of refining technique. Therefore, aluminum including a little amount of a foreign element can be used. Thus, an aluminum plate applicable to the present invention does not have a specified composition, and a conventionally known material of aluminum plate can be optionally utilized. A thickness of a support to be used in the present invention is about 0.05 to 0.6 mm, preferably 0.1 to 0.4 mm, and especially preferably 0.15 to 0.3 mm.

Prior to roughening an aluminum plate, if desired, in order to eliminate a rolling oil present on the surface, a degreasing treatment with, for example, a surfactant, an organic solvent or aqueous alkaline solution is effected.

The roughening treatment on the surface of an aluminum plate can be effected according to various methods. For example, as the method, can be used a method of mechanically surface-roughening, a method wherein a surface is electrochemically dissolved and roughened, and a method wherein a surface is chemically selectively dissolved. As the mechanical method, can be employed well-known methods such as ball abrasion method, brush abrasion method, blast abrasion method and buff abrasion method. As the chemical method, a method of immersing in an aqueous saturated solution of an aluminum salt of a mineral acid as described in JP-A-54-31187 is suitable. While, as the electrochemical surface-roughening method, a method effecting in an electrolyte comprising hydrochloric acid or nitric acid with alternating current or direct current may be exemplified. Further, an electrolysis surface-roughening method using mixed acids as disclosed in JP-A-54-63902 also can be utilized.

Of these surface-roughening methods, particularly, a surface-roughening method comprising a combination of a mechanical surface-roughening and an electrochemical surface-roughening as described in JP-A-55-137993 is preferable because of a strong adhesion of an ink-receptive image with a support.

The surface-roughening by the methods as described above is preferably effected in such a range that a centerline surface roughness (Ra) (as defined in JIS B 0601) of the surface of an aluminum plate may be 0.3 to 1.0 $\mu$m.

The surface-roughened aluminum plate thus obtained is optionally subjected to alkali etching treatment using an aqueous solution of, e.g., potassium hydroxide or sodium hydroxide, further subjected to a neutralizing treatment. Thereafter, if desired, an anodizing treatment is applied thereto for enhancing abrasion resistance.

As an electrolyte to be used in anodizing treatment of an aluminum plate, various electrolytes forming a porous oxidation film (i.e., a porous oxide film) can be used. Generally, as the electrolyte, sulfuric acid, hydrochloric acid, oxalic acid, chromic acid or the mixture thereof are used. A concentration of these electrolytes can be optionally determined depending upon a kind of an electrolyte.

Treatment conditions of anodizing may vary depending upon an electrolyte to be used and, therefore, cannot be simply determined. However, generally, the treatment conditions are appropriately as follows; a concentration of an electrolyte of 1 to 80% by weight solution, a liquid temperature of 5 to 70° C., an electric current density of 5 to 60 A/dm$^2$, a voltage of 1 to 100 V, and an electrolysis time of 10 seconds to 5 minutes.

An oxidation film amount to be formed is preferably 1.0 to 5.0 g/m$^2$, especially preferably 1.5 to 4.0 g/m$^2$. If it is less than 1.0 g/m$^2$, printing durability (i.e., press life) is sometimes insufficient or scratches are apt to be formed.

Of these anodizing treatments, a method of anodizing in sulfuric acid at a high current density described in U.S. Pat. No. 1,412,768, and a method of anodizing using phosphoric acid as an electrolysis bath described in U.S. Pat. No. 3,511,661 are preferable.

In a case where a heat-insulating layer is a hydrophobic resin, a support surface is desirably made to be hydrophobic. A hydrophobic treatment of a support surface is effected by coating an undercoating solution containing a silane coupling agent or optionally a titanium coupling agent. A silane coupling agent is mainly represented by formula $(R^{16}O)_3SiR^{17}$ (in the formula, $R^{16}$ and $R^{17}$ represent an alkyl group or a substituted alkyl group), an $R^{16}O$ group is subjected to hydrolysis to be an OH group, which is bonded with a support surface through an ether linkage, and an $R^{17}$ group provides a hydrophobic surface for receiving an ink.

As the silane coupling agent may be exemplified γ-chloropropyl trimethoxysilane, vinyltrimethoxysilane, vinyltriethoxysilane, vinyltris(β-methoxyethoxy)silane, γ-methacryloxypropyl trimethoxysilane, γ-glycidyloxypropyl trimethoxysilane, γ-aminopropyl triethoxysilane, γ-mercaptotrimethoxysilane, γ-ureidopropyl triethoxysilane and N-(β-aminoethyl)-(β-aminopropyl) dimethoxysilane.

In order to ensure adhesion with an image-recording layer, prior to being coated, electrification treatment is applied to a plastic support by a known method.

[Plate-making and Printing]

In the lithographic printing plate precursor of the present invention, an image is formed by heat. Specifically, direct image-wise recording by a thermal recording head, scanning exposure by infrared laser, high luminescent flash exposure with a xenon discharging lamp and infrared lamp exposure are employed. However, exposure with a solid high output infrared laser such as a semiconductor laser irradiating infrared ray having a wavelength of 700 to 1200 nm, or YAG laser is preferable.

The lithographic printing plate precursor of the present invention can be irradiated with a laser having an output of 0.1 to 300 W. While, when a pulse laser is used, it is preferable to irradiate a laser having a peak output of 1000 W, preferably 2000 W. An exposure time is preferably 0.001 to 1 msec/pixel, more preferably 0.002 to 1 msec/pixel. An exposed amount in this case is preferably 0.01 to 10 J/cm$^2$, more preferably 0.1 to 1 J/cm$^2$, and the most preferably 0.3 to 1 J/cm$^2$ in terms of a plate surface exposure strength prior to being modified with an image for printing.

In a case where a support is transparent, exposure also can be effected from the back side of the support through the support.

The lithographic printing plate precursor of the present invention having been subjected to image exposure can be attached to a printing press without effecting any additional treatment and printing can be effected by an ordinary procedure using an ink and dampening water.

The lithographic printing plate precursor is attached to the cylinder of the printing press and is exposed with laser installed in the printing press. Successively, using an ink and dampening water, printing can be effected according to an ordinary procedure.

Optionally, after exposure, on-press development also can be effected.

EXAMPLES

The present invention will be described in detail by way of Examples. However, the present invention is not construed as being limited by Examples.

Example I-1

Production Example of Hydrophobic Polymer Fine Particles

As an oil phase component, was prepared a solution comprising polymethyl methacrylate (weight average-molecular weight 15,000) 30.0 g, MEK 45.0 g, and surfactant Pionin A41C (produced by Takemoto Yushi (fats and oils) Co., Ltd.) 0.5 g. While, as an aqueous phase component, was prepared a solution comprising Snowtex (produced by Nissan Kagaku Kogyo (Nissan Chemical Industry) Co., Ltd., 20% aqueous solution of colloidal silica) 35.0 g and water 260.9 g. These solutions are mixed and further vigorously stirred with a homogenizer at 12,000 rpm for 10 minutes. Thus, could be obtained an emulsified dispersion wherein oil droplets are dispersed in the aqueous phase. Next, the emulsified dispersion obtained was placed into a stainless steel pot and stirred at 40° C. for 3 hours and the solvent component was removed, whereby hydrophobic polymer fine particles having a particle diameter of 0.48 μm could be obtained.

Examples I-2 to I-3 and Comparative Examples I-1 to I-3

Production Example of Hydrophobic Polymer Fine Particles

Polymer fine particles were produced in the same manner as in Example I-1, except that the hydrophobic polymer and fine particles of the oxide or the hydroxide used in Example I-1 were replaced with materials listed in Table I-1. The results are shown in Table I-1.

TABLE I-1

(Examples I-1 to I-3 and Comparative Examples I-1 to I-3)

| Example | Hydrophobic polymer | Oxide or hydroxide fine particles | Surfactant | Particle diameter μm |
|---|---|---|---|---|
| Example I-1 | PMMA | Snowtex C | Pionin A41C | 0.48 |
| Example I-2 | PI-1 | Snowtex C | Pionin A41C | 0.24 |
| Example I-3 | PI-1 | Snowtex S | Pionin A41C | 0.19 |
| Comp. Ex. I-1 | PMMA | None | Pionin A41C | No particle formation |
| Comp. Ex. I-2 | PMMA | None | Pionin A41C | No particle formation |
| Comp. Ex. I-3 | PMMA | Snowtex C | None | No particle formation |

From the above-results, it is apparent that in the production of polymer fine particles of the present invention, particles of oxides or hydroxides of elements belonging to groups 2 to 15 in the periodic table, and surfactants are essential elements of the present invention.

Examples I-4 to I-27 and Comparative Example I-4

Production Example of Polymer Fine Particles in Case of Further Adding a Water-soluble Resin to an Aqueous Phase Polymer fine particles were produced according to the same manner as in Example I-1, except that as materials, the hydrophobic polymers, fine particles of the oxides or the hydroxides, the water-soluble resins, and the surfactants described in Table I-2 were used. An addition amount of the water-soluble resin was 4.2 g. The results are shown in Table I-2.

TABLE I-2

(Examples I-4 to I-27 and Comparative Example I-4)

| Example | Hydrophobic polymer | Oxide or hydroxide fine particles | Water-soluble resin | Surfactant | Particle diameter (μm) |
|---|---|---|---|---|---|
| Example I-4 | PMMA | Snowtex C | PVA105 | Pionin A41C | 0.22 |
| Example I-5 | PI-1 | Snowtex C | PVA105 | Pionin A41C | 0.25 |
| Example I-6 | PI-1 | Snowtex C | Polyacryl amide | Pionin A41C | 0.32 |
| Example I-7 | PI-1 | Snowtex C | Polyacryl acetamide | Pionin A41C | 0.52 |
| Example I-8 | PI-1 | Snowtex C | Poly N-vinyl pyrrolidone | Pionin A41C | 0.18 |
| Example I-9 | PI-1 | Snowtex C | Poly 2-methyl-2-oxazolidine | Pionin A41C | 0.31 |

TABLE I-2-continued (Examples I-4 to I-27 and Comparative Example I-4)

| Example | Hydrophobic polymer | Oxide or hydroxide fine particles | Water-soluble resin | Surfactant | Particle diameter ($\mu$m) |
|---|---|---|---|---|---|
| Example I-10 | PI-1 | Snowtex C | Poly N,N-dimethyl acrylamide | Pionin A41C | 0.65 |
| Example I-11 | PI-1 | Snowtex C | Polyethylene glycol | Pionin A41C | 0.82 |
| Example I-12 | PI-1 | Snowtex C | Polyacrylic acid | Pionin A41C | 0.47 |
| Example I-13 | PI-1 | Snowtex C | Polyvinyl methylether | Pionin A41C | 1.02 |
| Example I-14 | PI-1 | Snowtex C | Polyethylene imime | Pionin A41C | 0.77 |
| Example I-15 | PI-1 | Snowtex 20 | PVA105 | Pionin A41C | 0.19 |
| Example I-16 | PI-1 | Alumina sol 100 | PVA105 | Pionin A41C | 0.27 |
| Example I-17 | PI-1 | Lithium silicate 75 | PVA105 | Pionin A41C | 0.30 |
| Example I-18 | PI-1 | Titania sol | PVA105 | Pionin A41C | 0.17 |
| Example I-19 | PI-1 | Water-containing titanium oxide | PVA105 | Pionin A41C | 0.33 |
| Example I-20 | PI-1 | Tin oxide | PVA105 | Pionin A41C | 0.51 |
| Example I-21 | PMMA | Snowtex C | PVA105 | Emerl NC | 0.20 |
| Example I-22 | PMMA | Snowtex C | PVA105 | Emulgen 920 | 0.21 |
| Example I-23 | PMMA | Snowtex C | PVA105 | Lipomin LA | 0.24 |
| Example I-24 | PI-2 | Snowtex C | PVA105 | Pionin A41C | 0.25 |
| Example I-25 | PI-3 | Snowtex C | PVA105 | Pionin A41C | 0.28 |
| Example I-26 | PI-4 | Snowtex C | PVA105 | Pionin A41C | 0.26 |
| Example I-27 | PI-5 | Snowtex C | PVA105 | Pionin A41C | 0.21 |
| Comp. Ex. I-4 | PMMA | None | PVA105 | Pionin A41C | No particle formation |

Abbreviations and trade names in the Table are as follows:

PMMA: polymethylmethacrylate (weight-average molecular weight 15,000)
Snowtex C: produced by Nissan Kagaku Kogyo (Nissan chemical industry) Co., Ltd., 20% aqueous solution of colloidal silica
Snowtex 20: produced by Nissan Kagaku Kogyo Co., Ltd., 20% aqueous solution of colloidal silica
Alumina sol 100: produced by Nissan Kagaku Kogyo Co., Ltd.,
Lithium silicate 75: produced by Nissan Kagaku Kogyo Co., Ltd.
Titania sol: STS-01, produced by Ishihara Sangyo Kaisha, Ltd.
Water-containing titanium oxide: PC-101, produced by Chitan Kogyo (titanium industry) Co., Ltd.
Tin oxide: Ceramase S-8, produced by Taki Kagaku (chemical) Co., Ltd.
PVA 105: polyvinyl alcohol produced by Kuraray, saponification degree 98.8%
PVA 205: polyvinyl alcohol produced by Kuraray, saponification degree 88.0%
Pionin A41C: anionic surfactant, produced by Takemoto Yushi (fats and oils) Co., Ltd.
Emerl NC: anionic surfactant, produced by Kao Co., Ltd.
Emulgen 920: nonionic surfactant, produced by Kao Co., Ltd.
Lipomin LA: amphoteric surfactant, produced by Lion Yushi (fats and oils) Co., Ltd.

Example I-28

Polymer Fine Particles Comprising a Light-to-heat Converting Agent Encapsulated Therein Polymer fine particles comprising a light-to-heat converting agent encapsulated therein were prepared according to the same manner as that of Example I-6, except that in producing polymer fine particles in Example I-6, a light-to-heat converting agent (IR-24 described in the present specification) 5.0 g was added to the oil phase component. The particle diameter was 0.38 $\mu$m.

Example I-29

Production of Lithographic Printing Plate Precursor and Evaluation Thereof

An aluminum material of JISA 105 comprising aluminum 99.5% by weight, copper 0.01% by weight, titanium 0.03% by weight, iron 0.3% by weight and silicon 0.1% by weight was rolled to have a thickness of 0.24 mm. The surface of the resulting rolled plate was subjected to graining using 20% by weight of an aqueous suspension of 400 mesh Pumice stone (produced by Kyoritsu Yogyo (ceramics)) and rolling brush (6, 10 nylon), followed by adequately washing.

Next, the resulting product was immersed in 10% by weight aqueous sodium hydroxide solution at 70° C. for 60 seconds to be subjected to etching, then washed with running water. The product obtained was further neutralized with 20% by weight aqueous nitric acid solution and washed with water. The resulting aluminum plate was subjected to an electrolysis surface-roughening treatment in 1.0% by weight aqueous nitric acid solution (containing 0.5% by weight aluminum nitrate) using a current having rectangular alternating wave form under the conditions of anode voltage of 12.7 V, a ratio of a cathode electrical quantity to an anode electrical quantity of 0.9, and the anode electrical quantity of 160 coulomb/dm$^2$. The surface roughness of the base thus obtained was 0.6 μm (Ra indication).

Successively, the treated product was immersed in 1% by weight aqueous sodium hydroxide solution at 40° C. for 30 seconds to be etched and washed with water. Next, the product was further immersed in 30% by weight aqueous sulfuric acid solution at 55° C. for 1 minute.

Further, the product obtained was subjected to anodizing treatment in 20% by weight aqueous sulfuric acid solution (containing 0.8% by weight of aluminum) at 35° C. using direct current so as to provide an anodized film amount of 2.5 g/dm$^2$. Thus treated product was washed with water and dried to prepare a support.

Next, on the aluminum support thus obtained, the image-recording layer coating solution having the following composition was coated so that the dry film weight may be 3.0 g/m$^2$ by means of a bar coater. Then, the coated product was dried in an oven at 100° C. for 3 minutes to prepare a lithographic printing plate precursor.

| (Composition of image-recording layer coating solution) | |
| --- | --- |
| 20% Aqueous solution of colloidal silica dispersion | 150 g |
| Sol-gel preparation solution | 66 g |
| Hydrophobic polymer fine particles of Example 1 (10% by weight aqueous dispersion) | 400 g |
| Light-to-heat converting agent (IR-10 described in the present specification) | 10 g |
| Water | 374 g |

The sol-gel preparation solution used here was obtained by preparing the solution having the following composition and aging the solution obtained at room temperature for 2 hours.

| (Sol-gel preparation solution) | |
| --- | --- |
| Tetramethoxysilane | 150 g |
| Ethanol | 300 g |
| 0.1 mol/liter nitric acid | 45 g |

A water droplet contact angle of the surface of the printing plate precursor thus prepared was determined. As the result, the surface showed distended wetting. Namely, the surface was extremely hydrophilic.

The above-described printing plate precursor was exposed by means of Trend Setter 3244VFS comprising a water-cooling system 40 W infrared semiconductor laser installed therein produced by Creo Co., Ltd., under the conditions of an outer face drum revolution number of 100 rpm, a plate surface energy of 200 mJ/cm$^2$, and a resolution degree of 2400 dpi to form an image area on the surface of the exposed area. A water droplet contact angle of the irradiated area surface is 96°, which showed that the irradiated surface had been converted to a highly hydrophobic surface. Thereafter, without effecting a development treatment, the printing plate precursor was attached to a printing press.

Were used as a printing press, the printing press SOR-M produced by Heidelberg Co., Ltd., as a dampening water, 1% by volume of aqueous solution of EU-3 (produced by Fuji photographic film Co., Ltd.), and as an ink, GEOS(N) Indian ink First, 10 times revolution roll up (warm-up operation) was effected with dampening water. Then printing was started by feeding an ink. High quality prints free from printing staining could be obtained until printing of 20,000 sheets.

Examples I-30 to I-55

Production of Lithographic Printing Plate Precursor and Evaluation Thereof

A plate material was produced in the same manner as in Example I-29 except that polymer fine particles produced in Example I-2 to I-27 were used instead of the hydrophobic polymer fine particles of Example I-1 used in the image-recording layer of Example I-29. Then, image-wise irradiation with laser exposure and printing were effected and the prints obtained were evaluated. As the result, in every Example, the surface of the printing plate precursor had an extremely high hydrophilic property, while in the irradiated area surface, hydrophobic degree was adequately high. Thus, a print was excellent in ink adhesion at the beginning of printing and up to 20,000 sheets, high quality prints free from staining due to printing could be obtained.

Examples I-56

Production of Lithographic Printing Plate Precursor and Evaluation Thereof

A plate material was produced in the same manner as in Example I-29 except that between the anodized aluminum support and the image-recording layer of Example I-29, was provided a heat-insulating layer formed by coating the heat-insulating layer coating solution having the following composition so as to provide a dry coated amount of 1.0 g/m$^2$.

| (Coating solution composition of heat-insulating layer) | |
| --- | --- |
| Butyral resin BM-S (produced by Sekisui Kagaku (chemical) Co., Ltd.) 10% MEK solution | 59 g |
| Carbon black dispersion (solid content 21%) | 13.5 g |
| MEK (methylethylketone) | 62.7 g |

Successively, an image-wise irradiation was effected with laser exposure and printing was effected. The results were that an image could be formed with a small amount of exposure energy (plate surface energy of 150 mJ/cm$^2$) as compared with Example I-29. As in Example I-29, up to 20,000 sheets, high quality prints free from staining due to printing could be obtained.

Examples I-57

Production of Lithographic Printing Plate Precursor and Evaluation Thereof

A plate material was produced in the same manner as in Example I -29 except that the light-to-heat converting agent IR-10 used in the image-recording layer in Example I-29 was replaced with silver colloid (average particle diameter of 10 nm) produced by Carey-Lea method.

A water droplet contact angle of surface of the printing plate precursor obtained was determined. As the result, the surface showed distended wetting. Namely, the surface was extremely hydrophilic.

Successively, an image-wise irradiation was effected with laser exposure and printing was effected. The results were that an image could be formed as in Example I-1, and up to 20,000 sheets, high quality prints free from staining due to printing could be obtained.

Examples I-58

Production of Lithographic Printing Plate Precursor and Evaluation Thereof

On the image-recording layer of the printing plate precursor described in Example I-29, the coating solution of the water-soluble protecting layer having the following composition was coated so as to provide a dry thickness of 0.5 g/m² by means of a bar coater, then, the coated product was dried in an oven at 100° C. for 1 minute.

| (Coating solution composition of water-soluble protecting layer) | |
|---|---|
| Polyacrylic acid (average molecular weight 20,000) 10% aqueous solution | 350 g |
| Light-to-heat converting agent (1% by weight aqueous solution) | 2.5 g |

Successively, an image-wise irradiation was effected with laser exposure and printing was effected. The results were that an image could be formed with a small amount of exposure energy (plate surface energy of 150 mJ/cm²) as compared with Example I-29. As in Example I-25, up to 20,000 sheets, high quality prints free from staining due to printing could be obtained.

Examples 1-59

Production of Lithographic Printing Plate Precursor and Evaluation Thereof

A plate material was produced in the same manner as in Example I-29 except that the aluminum support in Example I-29 was replaced with a 180 μm-thick polyethylene terephthalate film of which surface had been subjected to corona treatment. Then, image-wise irradiation with laser exposure and printing were effected and the prints obtained were evaluated. As the result, the surface of the printing plate precursor had an extremely high hydrophilic property, while in the irradiated area surface, hydrophobic degree was adequately high. Thus, a print was excellent in ink adhesion at the beginning of printing and up to 20,000 sheets, high quality printed matters free from staining due to printing could be obtained.

Examples I-60

Production of Lithographic Printing Plate Precursor and Evaluation Thereof

On the aluminum support produced in Example I-29, the coating solution of the image-recording layer having the following composition was coated so as to provide a dry thickness of 1.0 g/m² by means of a bar coater, then, the coated product was dried in an oven at 60° C. for 2 minutes.

| (Coating solution composition of image-recording layer) | |
|---|---|
| Polyacrylic acid (average molecular weight 20,000) 10% solution | 100 g |
| Polymer fine particles produced in Example I-28 (10% by weight water dispersion) | 800 g |
| Water | 100 g |

The lithographic printing plate wherein on-press development can be effected on a printing press thus obtained was exposed by means of Trend Setter 3244VFS comprising a water-cooling system 40 W infrared semiconductor laser installed therein produced by Creo Co., Ltd., under the conditions of an output of 9 W, an outer face drum revolution number of 105 rpm, a plate surface energy of 200 mJ/cm², and a resolution degree of 2400 dpi. Thereafter, without effecting any treatment, the printing plate was attached to the cylinder of the printing press SOR-M produced by Heidelberg Co., Ltd., Successively, a dampening water was fed and then an ink, thereafter paper sheets to effect printing. In every printing plate, on-press development could be effected without any problem and high quality prints free from printing staining could be obtained until printing of 20,000 sheets.

Example II-1

Production Example of Hydrophobic Polymer Fine Particles 1

As an oil phase component, was prepared a solution comprising a hydrophobic polymer (PI-1 described in the present specification) 30.0 g, MEK 45.0 g, and anionic surfactant Pionin A41C (produced by Takemoto Yushi (fats and oils) Co., Ltd.) 0.5 g. While, as an aqueous phase component, was prepared a solution comprising a water-soluble resin (WII-1 described in the present specification) 4.2 g and water 259.8 g. These solutions are mixed and further vigorously stirred with a homogenizer at 12,000 rpm for 10 minutes. Thus, could be obtained an emulsified dispersion wherein oil droplets are dispersed in the aqueous phase. Next, the emulsified dispersion obtained was placed into a stainless steel pot and stirred at 40° C. for 3 hours and the solvent component was removed, whereby hydrophobic polymer fine particles 1 having a particle diameter of 0.24 μm could be obtained.

Examples II-2 to II-25 and Comparative Examples II-1 to II-3

Polymer fine particles 2 to 25 were produced in the same manner as in Example II-1, except that the hydrophobic polymer, the water-soluble resin and the surfactant used in Example II-1 were replaced with materials listed in Table II-1. The results are shown in Table II-1.

TABLE II-2

(Examples II-1 to II-25 and Comparative Examples II-1 to II-3)

| Example | Hydrophobic polymer | Oxide or hydroxide fine particles | Water-soluble resin | Surfactant | Particle diameter ($\mu$m) |
|---|---|---|---|---|---|
| Example II-1 | PI-1 | None | WII-1 | Pionin A41C | 0.24 |
| Example II-2 | PI-1 | None | WII-2 | Pionin A41C | 0.27 |
| Example II-3 | PI-1 | None | WII-3 | Pionin A41C | 0.25 |
| Example II-4 | PI-1 | None | WII-4 | Pionin A41C | 0.33 |
| Example II-5 | PI-1 | None | WII-5 | Pionin A41C | 0.29 |
| Example II-6 | PI-1 | None | WII-6 | Pionin A41C | 0.51 |
| Example II-7 | PI-1 | None | WII-7 | Pionin A41C | 0.46 |
| Example II-8 | PI-1 | None | WII-8 | Pionin A41C | 0.73 |
| Example II-9 | PI-1 | None | WIII-1 | Pionin A41C | 0.88 |
| Example II-10 | PI-1 | None | WIII-2 | Pionin A41C | 0.22 |
| Example II-11 | PI-1 | None | WIII-3 | Pionin A41C | 0.95 |
| Example II-12 | PI-1 | None | WIII-4 | Pionin A41C | 0.12 |
| Example II-13 | PI-1 | None | WIII-5 | Pionin A41C | 0.75 |
| Example II-14 | PI-1 | None | WIII-6 | Pionin A41C | 0.46 |
| Example II-15 | P1-1 | None | WIII-7 | Pionin A41C | 0.32 |
| Example II-16 | PI-1 | None | WIII-8 | Pionin A41C | 0.57 |
| Example II-17 | PI-1 | None | WIII-9 | Pionin A41C | 0.67 |
| Example II-18 | PI-1 | None | WIII-10 | Pionin A41C | 0.34 |
| Example II-19 | PI-1 | Snowtex C | WII-1 | Pionin A41C | 0.20 |
| Example II-20 | PI-1 | Titania sol | WII-1 | Pionin A41C | 0.38 |
| Example II-21 | PI-1 | Snowtex C | WII-1 | Emerl NC | 0.23 |
| Example II-22 | PI-2 | None | WII-1 | Pionin A41C | 0.30 |
| Example II-23 | PI-3 | None | WII-1 | Pionin A41C | 0.27 |
| Example II-24 | PI-4 | None | WII-1 | Pionin A41C | 0.34 |
| Example II-25 | PI-5 | None | WII-1 | Pionin A41C | 0.25 |
| Comp. Ex. II-1 | PI-1 | None | PVA105 | Pionin A41C | No particle formation |
| Comp. Ex. II-2 | PMMA | None | WII-1 | Pionin A41C | No particle formation |
| Comp. Ex. II-3 | PMMA | None | PVA205 | None | 0.21 |

Abbreviations and trade names in the Table are as follows:

PMMA: polymethylmethacrylate (weight-average molecular weight 15,000)
Snowtex C: produced by Nissan Kagaku Kogyo (Nissan chemical industry) Co., Ltd., 20% aqueous solution of colloidal silica
Titania sol: STS-01, produced by Ishihara Sangyo Kaisha, Ltd.
PVA 105: polyvinyl alcohol produced by Kuraray, saponification degree 98.8%
PVA 205: polyvinyl alcohol produced by Kuraray, saponification degree 88.0%
Pionin A41C: anionic surfactant, produced by produced by Takemoto Yushi (fats and oils) Co., Ltd.
Emerl NC: anionic surfactant, produced by Kao Co., Ltd.

From these results, it is apparent that in the production of polymer fine particles of the present invention, an organic silicon functional group is essential for both hydrophobic polymer and water-soluble resin.

Examples-26

Production of Polymer Fine Particles Comprising a Light-to-heat Converting Agent Encapsulated Therein 26

Polymer fine particles 26 comprising a light-to-heat converting agent encapsulated therein were prepared according to the same manner as that of Example II-3, except that in producing polymer fine particles in Example II-3, a light-to-heat converting agent (IR-26 described in the present specification) 5.0 g was added to an oil phase component. The particle diameter was 0.30 $\mu$m.

Example II-27

Production Example of Hydrophobic Polymer Fine Particles 27

As an oil phase component, was prepared a solution comprising a hydrophobic polymer (PI-1) 20.0 g, polymethyl methacrylate (weight-average molecular weight 15,000) 10.0 g, MEK 45.0 g, and surfactant Pionin A41C (produced by Takemoto Yushi (fats and oils) Co., Ltd.) 0.5 g. While, as an aqueous phase component, was prepared a solution comprising a water-soluble resin (WII-1) 4.2 g and water 295.8 g. These solutions are mixed and further vigorously stirred with a homogenizer at 12,000rpm for 10 minutes. Thus, could be obtained an emulsified dispersion wherein oil droplets are dispersed in the aqueous phase. Next, the emulsified dispersion obtained was placed into a stainless steel pot and stirred at 40° C. for 3 hours and the solvent component was removed, whereby hydrophobic polymer fine particles 27 having a particle diameter of 0.21 $\mu$m could be obtained.

Example II-28

Production Example of Hydrophobic Polymer Fine Particles 28

As an oil phase component, was prepared a solution comprising a hydrophobic polymer (PI-1) 25.0 g, a light-to-heat converting agent (IR-24 described in the present specification) 5.0 g, MEK 45.0 g, and surfactant Pionin A41C (produced by Takemoto Yushi (fats and oils) Co., Ltd.) 0.5 g. While, as an aqueous phase component, was prepared a solution comprising a water-soluble resin (WII-1) 4.2 g and water 295.8 g. These solutions are mixed and further vigorously stirred with a homogenizer at 12,000 rpm for 10 minutes. Thus, could be obtained an emulsified dispersion wherein oil droplets are dispersed in the aqueous phase. Next, the emulsified dispersion obtained was placed into a stainless steel pot and stirred at 40° C. for 3 hours and the solvent component was removed, whereby hydrophobic polymer fine particles 28 having a particle diameter of 0.35 μm could be obtained.

Example II-29

Production of Lithographic Printing Plate Precursor and Evaluation Thereof

An aluminum material of JISA105 comprising 99.5% by weight of aluminum, copper 0.01% by weight, titanium 0.03% by weight, iron 0.3% by weight and silicon 0.1% by weight was rolled to have a thickness of 0.24 mm. The surface of the resulting rolled plate was subjected to graining using 20% by weight of an aqueous suspension of 400 mesh Purmice stone (produced by Kyoritsu Yogyo (ceramics)) and rolling brush (6, 10 nylon), followed by adequately washing.

Next, the resulting product was immersed in 10% by weight aqueous sodium hydroxide solution at 70° C. for 60 seconds to be subjected to etching, then washed with running water. The product obtained was further neutralized with 20% by weight aqueous nitric acid solution and washed with water. The resulting aluminum plate was subjected to an electrolysis roughening treatment in 1.0% by weight aqueous nitric acid solution (containing 0.5% by weight aluminum nitrate) using a current having rectangular alternating wave form under the conditions of anode voltage of 12.7 V, a ratio of a cathode electrical quantity to an anode electrical quantity of 0.9, and the anode electrical quantity of 160 coulomb/dm$^2$. The surface roughness of the base thus obtained was 0.6 μm (Ra indication).

Successively, the treated product was immersed in 1% by weight aqueous sodium hydroxide solution at 40° C. for 30 seconds to be etched and washed with water. Next, the product was further immersed in 30% by weight aqueous sulfuric acid solution at 55° C. for 1 minute.

Further, the product obtained was subjected to anodizing treatment in 20% by weight aqueous sulfuric acid solution (containing 0.8% by weight of aluminum) at 35° C. using direct current so as to provide an anodized film amount of 2.5 g/dm$^2$. Thus treated product was washed with water and then dried to prepare a support.

Next, on the aluminum support thus obtained, the image-recording layer coating solution having the following composition was coated so that the dry film mass may be 3.0 g/m$^2$ by means of a bar coater. Then, the coated product was dried in an oven at 100° C. for 3 minutes to prepare a lithographic printing plate precursor.

| (Composition of image-recording layer coating solution) | |
|---|---|
| 20% aqueous solution of Colloidal silica dispersion | 150 g |
| Sol-gel preparation solution | 66 g |
| Hydrophobic polymer fine particles 1 (10% by weight aqueous dispersion) | 400 g |

-continued

| (Composition of image-recording layer coating solution) | |
|---|---|
| Light-to-heat converting agent (IR-10 described in the specification) | 10 g |
| Water | 374 g |

The sol-gel preparation solution used here was obtained by preparing the solution having the following composition and aging the solution obtained at room temperature for 2 hours.

| (Sol-gel preparation solution) | |
|---|---|
| Tetramethoxysilane | 150 g |
| Ethanol | 300 g |
| 0.1 mol/liter nitric acid | 45 g |

A water droplet contact angle of the surface of printing plate precursor thus prepared was determined. As the result, the surface showed distended wetting. Namely, the surface was extremely hydrophilic.

The above-described printing plate precursor was exposed by means of Trend Setter 3244VFS comprising a water-cooling system 40 W infrared semiconductor laser installed therein produced by Creo Co., Ltd., under the conditions of an outer face drum revolution number of 100 rpm, a plate surface energy of 200 mJ/cm$^2{}_2$, and a resolution degree of 2400 dpi to form an image on the surface of the exposed area. A water droplet contact angle of the irradiated area surface was 102°, which showed that the irradiated surface had been converted to a highly hydrophobic surface. Thereafter, without effecting any development treatment, the printing plate precursor was used for printing.

Were used as a printing press, the printing press SOR-M produced by Heidelberg Co., Ltd., as a dampening water, 1% by volume of aqueous solution of EU-3 (produced by Fuji photographic film Co., Ltd.), and as an ink, GEOS(N) Indian ink.

First, 10 times revolution roll up (warm-up operation) was effected with dampening water. Then printing was started by feeding an ink. High quality prints free from printing staining could be obtained until printing of 20,000 sheets.

Examples II-30 to II-56

Production of Lithographic Printing Plate Precursor and Evaluation Thereof

Printing plate precursors were produced in the same manner as in Example II-29 except that the hydrophobic polymer fine particle 1 in the image-recording layer of Example II-29 was replaced with hydrophobic polymer fine particles 2 to 28, respectively. Then, image-wise irradiation with laser exposure and printing were effected and the prints obtained were evaluated, in the same manner as in Example II-29. As the result, the surface of the printing plate precursor had an extremely high hydrophilic property, while in the irradiated area surface, hydrophobic degree was adequately high. Thus, a print was excellent in ink adhesion at the beginning of printing and up to 20,000 sheets, high quality printed matters free from staining due to printing could be obtained.

Comparative Example II-4

Production of Lithographic Printing Plate Precursor for Comparison and Evaluation Thereof A printing plate precursor was produced in the same manner as in Example II-29 except that polymer fine particles obtained in Comparative Example II-3 were used. Then, image-wise irradiation with laser exposure and printing were effected and the prints obtained were evaluated as in Example II-29. As the result, in every printing plate, at the beginning of printing, an ink adhesion was excellent. However, at the time of printing of 10,000 sheets or more, a background stain occurred. While at the time of printing of 20,000 sheets or more, poor adhesion of the ink occurred due to abrasion of an image part. Therefore, desirable prints could not be obtained.

Examples II-57

Production of Lithographic Printing Plate Precursor and Evaluation Thereof

A plate material was produced in the same manner as in Example II-29 except that between the aluminum support and the image-recording layer of Example II-29, was provided the heat-insulating layer having the following composition (a dry coated amount of 1.0 g/m$^2$).

| (Coating solution composition of heat-insulating layer) | |
|---|---|
| Butyral resin BM-S (produced by Sekisui Kagaku (chemical) Co., ltd.) 10% MEK solution | 59 g |
| Carbon black dispersion (solid content 21%) | 13.5 g |
| MEK (methylethylketone) | 62.7 g |

Successively, an image-wise irradiation was effected with laser exposure and printing was effected. The results were that an image could be formed with a small amount of exposure energy (plate surface energy of 150 mJ/cm$^2$) as compared with Example II-28. As in Example II-29, up to 20,000 sheets, high quality prints free from staining due to printing could be obtained.

Examples II-58

Production of Lithographic Printing Plate Precursor and Evaluation Thereof

A plate material was produced in the same manner as in Example II-29 except that the light-to-heat converting agent IR-10 used in the image-recording layer in Example II-29 was replaced with silver colloid (average particle diameter of 10 nm) produced by Carey-Lea method.

A water droplet contact angle on the surface of the printing plate precursor obtained was determined. As the result, the surface showed distended wetting. Namely, the surface was extremely hydrophilic.

Successively, an image-wise irradiation was effected with laser exposure and printing was effected. The results were that an image could be formed as in Example II-29, and up to 20,000 sheets, high quality prints free from staining due to printing could be obtained.

Examples II-59

Production of Lithographic Printing Plate Precursor and Evaluation Thereof

On the hydrophilic image-recording layer of the printing plate precursor described in Example II-29, the coating solution of the water-soluble protecting layer having the following composition was coated so as to provide a dry thickness of 0.5 g/m$^2$ by means of a bar coater, then, the coated product was dried in an oven at 100° C. for 1 minute.

| (Coating solution of water-soluble protecting layer) | |
|---|---|
| 10% aqueous solution of polyacrylic acid (average molecular weight 20,000) | 350 g |
| Light-to-heat converting agent (1% by weight aqueous solution) | 2.5 g |

Successively, an image-wise irradiation was effected with laser exposure and printing was effected. The results were that an image could be formed with a small amount of exposure energy (plate surface energy of 150 mJ/cm$^2$) as compared with Example II-29. As in Example 11-29, up to 20,000 sheets, high quality prints free from staining due to printing could be obtained.

Examples II-60

Production of Lithographic Printing Plate Precursor and Evaluation Thereof

A plate material was produced in the same manner as in Example II-29 except that the aluminum support in Example II-29 was replaced with a 180 µm-thick PET base of which surface had been subjected to corona treatment. Then, image-wise irradiation with laser exposure and printing were effected and the prints obtained were evaluated. As the result, the surface of the printing plate precursor had an extremely high hydrophilic property, while in the irradiated area surface, hydrophobic degree is adequately high. Thus, a print is excellent in ink adhesion at the beginning of printing and up to 20,000 sheets, high quality prints free from staining due to printing could be obtained.

Examples II-61

Production of Lithographic Printing Plate Precursor and Evaluation Thereof

On the aluminum support produced in Example II-29, the coating solution of the image-recording layer having the following composition was coated so as to provide a dry thickness of 1.0 g/m$^2$ by means of a bar coater, then, the coated product was dried in an oven at 60° C. for 2 minutes.

| (Coating solution composition of image-recording layer) | |
|---|---|
| 10% aqueous solution of polyacrylic acid (average molecular weight 20,000) | 100 g |
| Hydrophobic polymer fine particles 26 (10% by weight water dispersion) | 900 g |

The lithographic printing plate wherein development can be effected on an apparatus thus obtained was exposed by means of Trend Setter 3244VFS comprising a water-cooling system 40 W infrared semiconductor laser installed therein produced by Creo Co., Ltd., under the conditions of an output of 9 W, an outer face drum revolution number of 105 rpm, a plate surface energy of 200 mJ/cm$^2$, and a resolution degree of 2400 dpi. Thereafter, without effecting a treatment, the printing plate was attached to the cylinder of the printing press SOR-M produced by Heidelberg Co., Ltd., Successively, a dampening water was fed and then an ink, thereafter paper sheets to effect printing. In every printing plate, development on the apparatus could be effected without any problem and high quality prints free from printing staining could be obtained until printing of 20,000 sheets.

According to the present invention, can be provided a process for producing polymer fine particles suitable for the production of a lithographic printing plate precursor which can effect printing by directly being attached to a printing press without being subjected to any treatment after exposure, as well as a lithographic printing plate precursor improved in prevention of staining and printing durability using polymer fine particles produced by this method.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A process for producing polymer fine particles comprising: dispersing a solution obtained by dissolving a hydrophobic polymer in a solvent immiscible with water in an aqueous phase comprising fine particles of an oxide or hydroxide of at least one element selected from the group consisting of elements belonging to 2 to 15 groups in the periodic table using a surfactant so as to provide oil droplets containing the solvent immiscible with water and the hydrophobic polymer, and then removing the solvent from the oil droplets to form polymer fine particles dispersed in water; wherein the hydrophobic polymer has the structural unit represented by the following formula (I):

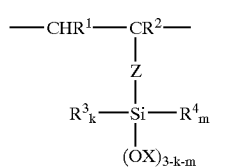

(I)

wherein $R^1$, $R^2$ and $R^3$ each represents a hydrogen atom or a hydrocarbon group having 8 or less carbon atoms. $R^4$ represents an alkoxy group or acyloxy group having 1 to 40 carbon atoms. k represents an integer of 0 to 2, m represents an integer of 0 to 3, the sum of k and m is 3 or less, X represents a monovalent metal or a hydrogen atom, Z represents a group selected from the group consisting of the following groups:

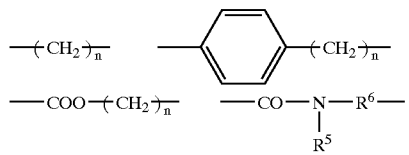

wherein $R^5$ represents a hydrogen atom or a hydrocarbon group having 8 or less carbon atoms, $R^6$ represents an alkylene group having 5 or less carbon atoms or a divalent organic residue formed by linking plural chain carbon atomic groups each other through a carbon atom or a nitrogen atom, n represents an integer of 0 to 4.

2. The process for producing polymer fine particles as claimed in claim 1, wherein a water-soluble resin is further included in the aqueous phase comprising fine particles of an oxide or hydroxide of at least one element selected from the group consisting of elements belonging to 2 to 15 groups in the periodic table.

3. The process for producing polymer fine particles as claimed in claim 2, wherein the water-soluble resin is at least one kind of resin selected from the group consisting of polyvinyl alcohol, polyacrylamide, polyvinyl pyrrolidone, polyacryl acetamide, polyoxazoline, polydimethyl acrylainide, polyethylene glycol, polyacrylic acid, polyvinylmethyl ether and polyethylene imine.

4. A process for producing polymer fine particles as claimed in claim 1, wherein a solution obtained by dissolving a hydrophobic polymer in a solvent immiscible with water is dispersed in an aqueous phase comprising a water-soluble resin, and then the solvent is removed from the oil droplets to form polymer fine particles dispersed in water; and the hydrophobic polymer has the structural unit represented by the following formula (I), and the water-soluble resin has the structural unit represented by the following formula (II) or (III):

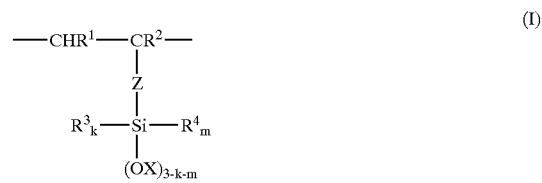

(I)

wherein $R^1$, $R^2$ and $R^3$ each represents a hydrogen atom or a hydrocarbon group having 8 or less carbon atoms, $R^4$ represents an alkoxy group or acyloxy group having 1 to 40 carbon atoms, k represents an integer of 0 to 2, m represents an integer of 0 to 3, the sum of k and m is 3 or less, X represents a monovalent metal or a hydrogen atom, Z represents a group selected from the group consisting of the following groups;

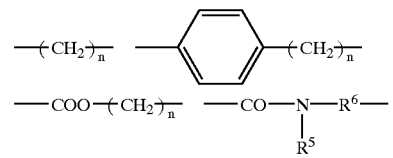

wherein $R^5$ represents a hydrogen atom or a hydrocarbon group having 8 or less carbon atoms, $R^6$ represents an alkylene group having 5 or less carbon atoms or a divalent organic residue formed by linking plural chain atomic groups each other through a carbon atom or a nitrogen atom, n represents an integer of 0 to 4:

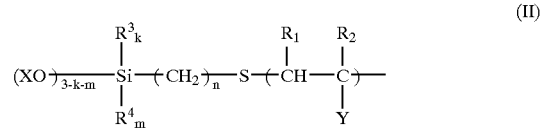

(II)

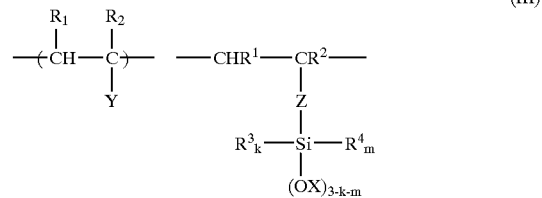

(III)

wherein $R^1$ to $R^4$, X, k and m have the same meaning as those in formula (I), Y represents —NHCOCH$_3$, —CONH$_2$, —CON(CH$_3$)$_2$, —COCH$_3$, —OH, —CO$_2$M, —OCH$_3$ or the following group, M represents a hydrogen atom or a metal ion, and n represents an integer of 1 to 8.

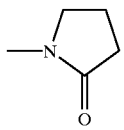

5. A lithographic printing plate precursor comprising on a support a hydrophilic image-recording layer; containing polymer fine particles obtained by a process for producing the polymer fine particles, wherein a solution obtained by dissolving a hydrophobic polymer in a solvent immiscible with water is dispersed in the aqueous phase comprising fine particles of an oxide or hydroxide of at least one element selected from the group consisting of elements belonging to 2 to 15 groups in the periodic table using a surfactant so as to provide oil droplets containing the solvent immiscible with water and the hydrophobic polymer, and then the solvent is removed from the oil droplets to form polymer fine particles dispersed in water; and the hydrophobic polymer has the structural unit represented by the following formula (I):

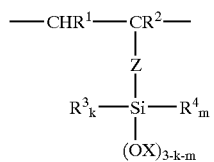

wherein $R^1$, $R^2$ and $R^3$ each represents a hydrogen atom or a hydrocarbon group having 8 or less carbon atoms, $R^4$ represents an alkoxy group or acyloxy group having 1 to 40 carbon atoms, k represents an integer of 0 to 2, m represents an integer of 0 to 3, the sum of k and m is 3 or less, X represents a monovalent metal or a hydrogen atom, Z represents a group selected from the group consisting of the following groups;

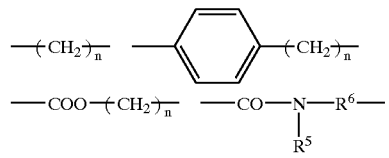

wherein $R^5$ represents a hydrogen atom or a hydrocarbon group having 8 or less carbon atoms, $R^6$ represents an alkylene group having 5 or less carbon atoms or a divalent organic residue formed by linking plural chain carbon atomic groups each other through a carbon atom or a nitrogen atom, n represents an integer of 0 to 4; and having a property which can be converted from hydrophilic to hydrophobic by heating.

6. A lithographic printing plate precursor comprising on a support a hydrophilic image-recording layer: containing polymer fine particles obtained by a process for producing the polymer fine particles, wherein a solution obtained by dissolving a hydrophobic polymer in a solvent immiscible with water is dispersed in an aqueous phase comprising a water-soluble resin so as to provide oil droplets containing the solvent immiscible with water and the hydrophobic polymer, and then the solvent is removed from the oil droplets to form polymer fine particles dispersed in water; and the hydrophobic polymer has the structural unit represented by the following formula (1), and the water-soluble resin has the structural unit represented by the following formula (II) or (III):

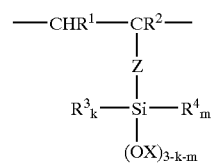

wherein $R^1$, $R^2$ and $R^3$ each represents a hydrogen atom or a hydrocarbon group having 8 or less carbon atoms, $R^4$ represents an alkoxy group or acyloxy group having 1 to 40 carbon atoms, k represents an integer of 0 to 2, m represents an integer of 0 to 3, the sum of k and m is 3 or less, X represents a monovalent metal or a hydrogen atom, Z represents a group selected from the group consisting of the following groups;

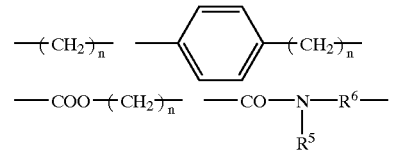

wherein $R^5$ represents a hydrogen atom or a hydrocarbon group having 8 or less carbon atoms, $R^6$ represents an alkylene group having 5 or less carbon atoms or a divalent organic residue formed by linking plural chain atomic groups with each other through a carbon atom or a nitrogen atom, n represents an integer of 0 to 4:

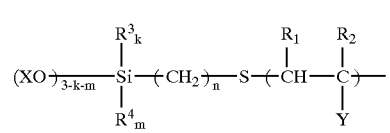

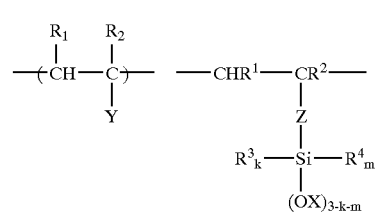

wherein $R^1$ to $R^4$, X, k and m have the same meaning as those in formula (I), Y represents —NHCOCH$_3$, —CONH$_2$, —CON(CH$_3$)$_2$, —COCH$_3$, —OH, —CO$_2$M, —OCH$_3$ or the following group, M represents a hydrogen atom or a metal ion, and n represents an integer of 1 to 8; and having a property which can be converted from hydrophilic to hydrophobic by heating.

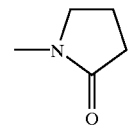

* * * * *